United States Patent
Jia

(10) Patent No.: US 12,021,070 B2
(45) Date of Patent: Jun. 25, 2024

(54) DISPLAY, ELECTRONIC DEVICE, AND DISPLAY FABRICATION METHOD

(71) Applicant: Honor Device Co., Ltd., Shenzhen (CN)

(72) Inventor: Yanfeng Jia, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 379 days.

(21) Appl. No.: 17/418,386

(22) PCT Filed: Dec. 28, 2018

(86) PCT No.: PCT/CN2018/124694
§ 371 (c)(1),
(2) Date: Jun. 25, 2021

(87) PCT Pub. No.: WO2020/133161
PCT Pub. Date: Jul. 2, 2020

(65) Prior Publication Data
US 2022/0149024 A1    May 12, 2022

(51) Int. Cl.
*H10K 59/121*     (2023.01)
*H01L 25/16*      (2023.01)
(Continued)

(52) U.S. Cl.
CPC ......... *H01L 25/167* (2013.01); *H10K 59/121* (2023.02); *H01L 33/62* (2013.01); *H10K 59/124* (2023.02)

(58) Field of Classification Search
CPC ... H01L 25/167; H01L 33/62; H01L 25/0753; H01L 27/1214; H01L 27/156;
(Continued)

(56) References Cited

U.S. PATENT DOCUMENTS 10,147,769 B2    12/2018    Lee et al.
10,249,844 B2     4/2019    Chou et al.
(Continued)

FOREIGN PATENT DOCUMENTS

CN    201374154 Y    12/2009
CN    102662562 A     9/2012
(Continued)

*Primary Examiner* — Bitew A Dinke
(74) *Attorney, Agent, or Firm* — Rimon PC

(57) ABSTRACT

This application provides a display, an electronic device, and a display fabrication method. The display includes a substrate; a driver circuit backplane, including a plurality of driver circuit units, where the driver circuit backplane is disposed above the substrate; a first pixel layer, including a plurality of pixels, where each pixel of the first pixel layer includes a plurality of subpixels, each subpixel of the first pixel layer includes one organic light-emitting diode OLED component, the first pixel layer is disposed above the driver circuit backplane, and the OLED component of each subpixel of the first pixel layer is connected to at least one driver circuit unit in the driver circuit backplane; and a second pixel layer, including a first electrode layer, a second electrode layer, and a plurality of pixels disposed between the first electrode layer and the second electrode layer, where each pixel of the second pixel layer includes a plurality of subpixels, each subpixel of the second pixel layer includes one micro light-emitting diode micro LED component, the second pixel layer is disposed above the substrate and surrounds the first pixel layer. The display has a narrower bezel.

20 Claims, 21 Drawing Sheets

(51) Int. Cl.
*H01L 33/62* (2010.01)
*H10K 59/124* (2023.01)

(58) Field of Classification Search
CPC .. H01L 33/486; H10K 59/124; H10K 59/121; H10K 59/70; H10K 59/123; H10K 59/35; G09G 3/32; G09G 3/3233; G09G 2300/0426; G09G 2300/0452; G09F 9/335; G09F 9/35; G09F 9/33
See application file for complete search history.

(56) References Cited

U.S. PATENT DOCUMENTS

| | | | |
|---|---|---|---|
| 10,338,876 | B2 | 7/2019 | Kim et al. |
| 10,566,394 | B2 | 2/2020 | Cai et al. |
| 2008/0211413 | A1* | 9/2008 | Nakamura ............... G09G 3/32 345/84 |
| 2015/0092442 | A1* | 4/2015 | Wu ...................... G02B 6/0053 362/613 |
| 2016/0372514 | A1* | 12/2016 | Chang ................ H01L 27/1259 |
| 2017/0062674 | A1* | 3/2017 | Kwon ................. H01L 25/0753 |
| 2017/0064291 | A1* | 3/2017 | Do .......................... G06F 3/147 |
| 2017/0242549 | A1* | 8/2017 | Lim ...................... G06F 3/0421 |
| 2017/0294451 | A1* | 10/2017 | Kim ..................... H01L 25/167 |
| 2018/0083218 | A1* | 3/2018 | Choi ................... H10K 50/814 |
| 2018/0166512 | A1 | 6/2018 | Hack et al. |
| 2018/0286843 | A1* | 10/2018 | Jeong ................... H01L 25/167 |
| 2019/0080649 | A1* | 3/2019 | Lee ..................... H01L 27/1251 |
| 2019/0214376 | A1* | 7/2019 | Kim .................... H01L 27/1259 |
| 2021/0265420 | A1* | 8/2021 | Itou ....................... H01L 33/382 |

FOREIGN PATENT DOCUMENTS

| | | | |
|---|---|---|---|
| CN | 103295481 | A | 9/2013 |
| CN | 104900167 | A | 9/2015 |
| CN | 105070744 | A * | 11/2015 |
| CN | 105070744 | A | 11/2015 |
| CN | 105093600 | A | 11/2015 |
| CN | 106229330 | A | 12/2016 |
| CN | 106373493 | A | 2/2017 |
| CN | 106549034 | A | 3/2017 |
| CN | 107068715 | A | 8/2017 |
| CN | 107221291 | A | 9/2017 |
| CN | 107240355 | A | 10/2017 |
| CN | 107359178 | A | 11/2017 |
| CN | 107887405 | A | 4/2018 |
| CN | 207217597 | U | 4/2018 |
| CN | 108133671 | A | 6/2018 |
| CN | 108172597 | A | 6/2018 |
| CN | 108766987 | A | 11/2018 |
| CN | 108877538 | A | 11/2018 |
| CN | 108878493 | A | 11/2018 |
| CN | 108986678 | A | 12/2018 |
| CN | 108986678 | B | 11/2020 |
| JP | 2004191487 | A | 7/2004 |
| JP | 2006195376 | A | 7/2006 |

* cited by examiner

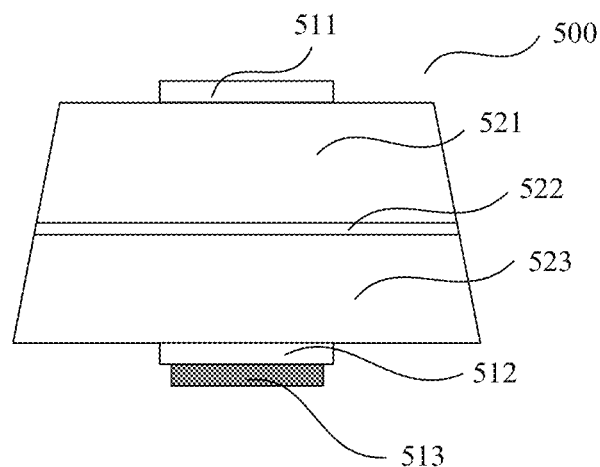
FIG. 7
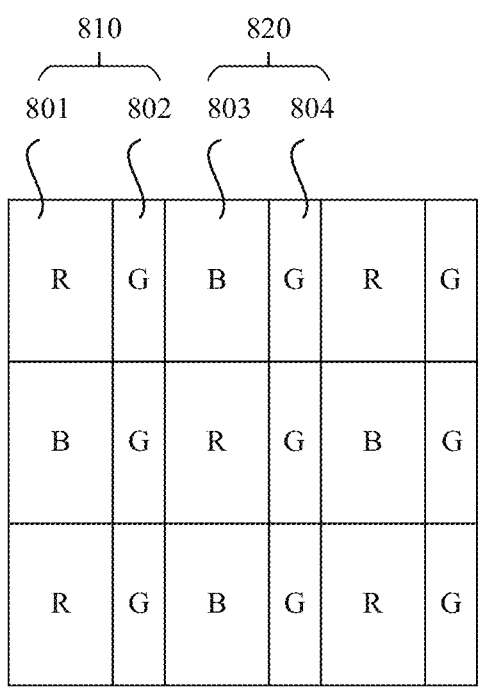
FIG. 8A-1
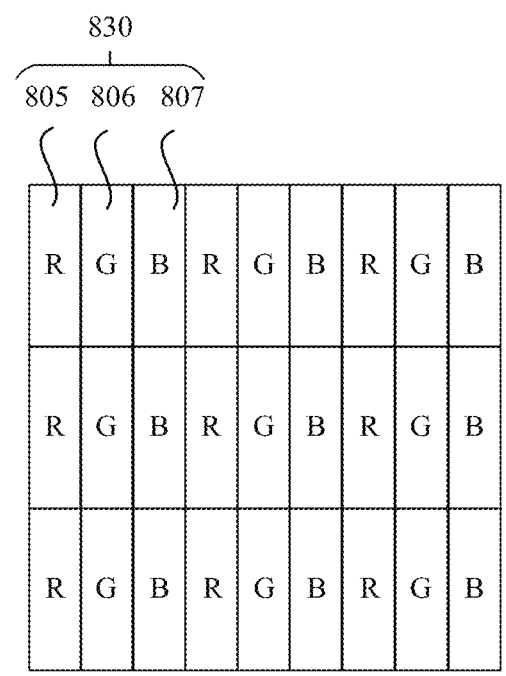
FIG. 8A-2
FIG. 8A

DISPLAY, ELECTRONIC DEVICE, AND DISPLAY FABRICATION METHOD

CROSS-REFERENCE TO RELATED APPLICATIONS

This application is a national stage of International Application No. PCT/CN2018/124694, filed on Dec. 28, 2018, which is hereby incorporated by reference in its entirety.

TECHNICAL FIELD

This application relates to the field of displays, and in particular, to micro LED and AMOLED technologies.

BACKGROUND

An active-matrix organic light-emitting diode (Active-matrix Organic Light Emitting Diode, AMOLED) display technology is most widely used in the field of organic light-emitting diodes (Organic Light Emitting Diode, OLED). An independent thin film transistor TFT drive control unit is used in an AOLED display to control light emission of each OLED pixel in the AMOLED display. An organic light-emitting material used for the OLED pixel is particularly sensitive to oxygen gas and water vapor. Therefore, to avoid rapid deterioration in performance of the AOLED display caused because the organic light-emitting material is oxidized after coming into contact with water and air, a package layer with a specific width, that is, a bezel, is provided around the AMOLED display. In the prior art, because there is no display unit in a bezel region, content of a picture cannot be displayed in the bezel region. Therefore, how to narrow down a non-display region of an AMOLED display becomes an important issue.

SUMMARY

To resolve the foregoing technical issue, embodiments of this application provide a display, a display fabrication method, and an electronic device using the display. The technical solutions are as follows.

According to a first aspect, an embodiment of this application provides a display, including: a substrate, configured to carry components of the display; a driver circuit backplane, including a plurality of driver circuit units, where the driver circuit backplane is disposed above the substrate; a first pixel layer, including a plurality of pixels, where each pixel of the first pixel layer includes a plurality of subpixels, each subpixel of the first pixel layer includes one organic light-emitting diode OLED component, the first pixel layer is disposed above the driver circuit backplane, and the OLED component of each subpixel of the first pixel layer is connected to at least one driver circuit unit in the driver circuit backplane; and a second pixel layer, including a first electrode layer, a second electrode layer, and a plurality of pixels disposed between the first electrode layer and the second electrode layer, where each pixel of the second pixel layer includes a plurality of subpixels, each subpixel of the second pixel layer includes one micro light-emitting diode micro LED component, the second pixel layer is disposed above the substrate and surrounds the first pixel layer, and an area of the second pixel layer is less than that of the first pixel layer. This is conducive to narrowing down a non-display region of the display.

With reference to the first aspect, a touch-sensitive surface may further be disposed above the display.

In a possible implementation, the micro LED component is a vertical type micro LED component, and the vertical type micro LED component includes a top electrode and a bottom electrode, where the second electrode layer is above the first electrode layer, the bottom electrode of the vertical type micro LED component is connected to the first electrode layer, and the top electrode of the vertical type micro LED component is connected to the second electrode layer. In this way, the two electrode layers connected to the vertical type micro LED component can be separately fabricated, thereby reducing a difficulty of a fabrication process.

In a possible implementation, the second pixel layer further includes a passivation layer, and the passivation layer is disposed between the first electrode layer and the second electrode layer and covers the vertical type micro LED component. In this way, the passivation layer can isolate the first electrode layer from the second electrode layer, and can also isolate different vertical type micro LED components from each other.

In a possible implementation, the passivation layer is provided with an opening above the top electrode of the vertical type micro LED component, and the top electrode is connected to the second electrode layer through the opening. In this way, the vertical type micro LED component needs to be accurately placed only on the first electrode layer, without considering a position of the second electrode layer.

With reference to the first aspect, the passivation layer may be disposed on the first electrode layer, and the vertical type micro LED component is connected to the first electrode layer through stamping.

With reference to the first aspect, after the first electrode layer is fabricated, the vertical type micro LED component may be connected to the first electrode layer through bonding, and then the passivation layer is fabricated to cover the vertical type micro LED component. In this way, a process of installing the vertical type micro LED component and the first electrode layer is simpler.

In a possible implementation, each driver circuit unit includes a plurality of transistors, source electrodes and drain electrodes of all transistors of the driver circuit backplane form a third electrode layer, gate electrodes of all the transistors of the driver circuit backplane form a fourth electrode layer, and the first electrode layer is located at the same layer as the third electrode layer or the fourth electrode layer. In this way, the first electrode layer can be fabricated by using an existing process and device, without a need to be separately designed.

In a possible implementation, the first electrode is connected to a positive voltage of a power source, and the second electrode is connected to a negative voltage of the power source. In this way, the first electrode and the first pixel layer can share a circuit that provides the positive voltage.

In a possible implementation, a subpixel arrangement manner of the second pixel layer is a Pentile arrangement or a Bayer arrangement. In this way, only two subpixels need to be disposed for each pixel, thereby reducing a quantity of subpixels.

In a possible implementation, the display further includes a thin film package layer, and the thin film package layer is disposed above the second electrode and covers the second electrode; or the display further includes a light shielding layer, and the light shielding layer is disposed above the driver circuit backplane and covers the first electrode layer; or the vertical type micro LED component includes an n-doped layer and a p-doped layer, the n-doped layer is connected to the top electrode of the vertical type micro LED component, and the p-doped layer is connected to the bottom electrode of the vertical type micro LED component; or the first electrode layer is an opaque electrode layer, and the second electrode layer is a transparent electrode layer.

According to a second aspect, an embodiment of this application provides a display, including: a substrate, configured to carry components of the display; a driver circuit backplane, including a plurality of driver circuit units, where the driver circuit backplane is disposed above the substrate; a first pixel layer, including a plurality of pixels, where each pixel of the first pixel layer includes a plurality of subpixels, each subpixel of the first pixel layer includes one organic light-emitting diode OLED component, the first pixel layer is disposed above the driver circuit backplane, and the OLED component of each subpixel of the first pixel layer is connected to at least one driver circuit unit in the driver circuit backplane; and a second pixel layer, including a plurality of pixels, where each pixel of the second pixel layer includes a plurality of subpixels, each subpixel of the second pixel layer includes one micro light-emitting diode micro LED component, the second pixel layer is disposed above the driver circuit backplane and surrounds the first pixel layer, an area of the second pixel layer is less than that of the first pixel layer, and the micro LED component of each subpixel of the second pixel layer is connected to at least one driver circuit unit in the driver circuit backplane. This is conducive to narrowing down a non-display region of the display.

With reference to the first aspect, a touch-sensitive surface may further be disposed above the display.

In a possible implementation, the micro LED component is a flip-type micro LED component, the flip-type micro LED component includes a P electrode and an N electrode, and the P electrode and the N electrode are located on a same side of the flip-type micro LED component. In this way, the P electrode and the N electrode are located at a same layer and can be fabricated together.

In a possible implementation, the P electrode or the N electrode of the flip-type micro LED component is connected to at least one driver circuit unit.

In a possible implementation, the display further includes a thin film package layer, and the thin film package layer covers the first pixel layer and the second pixel layer. In this way, the thin film package layer is flexible, so that flexibility of the display can be kept.

In a possible implementation, the driver circuit unit is a 2T1C driver circuit unit or a 5T1C driver circuit unit. In this way, the 5T1C driver circuit unit can make the flip-type micro LED component emit light more stably and evenly.

With reference to the second aspect, the driver circuit unit may be a 4T2C driver circuit unit.

In a possible implementation, a driver circuit unit of the flip-type micro LED component is connected to a negative voltage of a power source, and the P electrode of the flip-type micro LED component is connected to a positive voltage of the power source. In this way, the P electrode and the first pixel layer can share a circuit that provides the positive voltage.

In a possible implementation, a subpixel arrangement manner of the second pixel layer is a Pentile arrangement or a Bayer arrangement. In this way, only two subpixels need to be disposed for each pixel, thereby reducing a quantity of subpixels.

In a possible implementation, the flip-type micro LED component is connected to the driver circuit unit through bonding; or the thin film package layer includes a first inorganic package layer, a second organic package layer, and a third inorganic package layer; or the display further includes a passivation layer, and the passivation layer is disposed above the driver circuit backplane and below the first pixel layer and the second pixel layer; or the display further includes a planarization layer, and the planarization layer is disposed above the driver circuit backplane and below the first pixel layer and the second pixel layer; or the display further includes a light shielding layer, and the light shielding layer is disposed above the driver circuit backplane and covers the first electrode layer; or the first electrode layer and the second electrode layer are opaque electrode layers.

According to a third aspect, this application provides an electronic device, including a display and a battery. The display includes: a substrate, configured to carry components of the display; a driver circuit backplane, including a plurality of driver circuit units, where the driver circuit backplane is disposed above the substrate; a first pixel layer, including a plurality of pixels, where each pixel of the first pixel layer includes a plurality of subpixels, each subpixel of the first pixel layer includes one organic light-emitting diode OLED component, the first pixel layer is disposed above the driver circuit backplane, and the OLED component of each subpixel of the first pixel layer is connected to at least one driver circuit unit in the driver circuit backplane; and a second pixel layer, including a first electrode layer, a second electrode layer, and a plurality of pixels disposed between the first electrode layer and the second electrode layer, where each pixel of the second pixel layer includes a plurality of subpixels, each subpixel of the second pixel layer includes one micro light-emitting diode micro LED component, the second pixel layer is disposed above the substrate and surrounds the first pixel layer, and an area of the second pixel layer is less than that of the first pixel layer. The driver circuit backplane, the first electrode layer, and the second electrode layer are coupled to the battery. This is conducive to narrowing down a non-display region of the display.

In a possible implementation, the micro LED component is a vertical type micro LED component, and the vertical type micro LED component includes a top electrode and a bottom electrode, where the second electrode layer is above the first electrode layer, the bottom electrode of the vertical type micro LED component is connected to the first electrode layer, and the top electrode of the vertical type micro LED component is connected to the second electrode layer. In this way, the two electrode layers connected to the vertical type micro LED component can be separately fabricated, thereby reducing a difficulty of a fabrication process.

In a possible implementation, the second pixel layer further includes a passivation layer, and the passivation layer is disposed between the first electrode layer and the second electrode layer and covers the vertical type micro LED component. In this way, the passivation layer can isolate the first electrode layer from the second electrode layer, and can also isolate different vertical type micro LED components from each other.

In a possible implementation, the passivation layer is provided with an opening above the top electrode of the vertical type micro LED component, and the top electrode is connected to the second electrode layer through the opening. In this way, the vertical type micro LED component needs to be accurately placed only on the first electrode layer, without considering a position of the second electrode layer.

With reference to the third aspect, the passivation layer may be disposed on the first electrode layer, and the vertical type micro LED component is connected to the first electrode layer through stamping.

With reference to the third aspect, after the first electrode layer is fabricated, the vertical type micro LED component may be connected to the first electrode layer through bonding, and then the passivation layer is fabricated to cover the vertical type micro LED component. In this way, a process of installing the vertical type micro LED component and the first electrode layer is simpler.

In a possible implementation, each driver circuit unit includes a plurality of transistors, source electrodes and drain electrodes of all transistors of the driver circuit backplane form a third electrode layer, gate electrodes of all the transistors of the driver circuit backplane form a fourth electrode layer, and the first electrode layer is located at the same layer as the third electrode layer or the fourth electrode layer. In this way, the first electrode layer can be fabricated by using an existing process and device, without a need to be separately designed.

In a possible implementation, the first electrode is connected to a positive voltage of the battery, and the second electrode is connected to a negative voltage of the battery. In this way, the first electrode and the first pixel layer can share a circuit that provides the positive voltage.

In a possible implementation, a subpixel arrangement manner of the second pixel layer is a Pentile arrangement or a Bayer arrangement. In this way, only two subpixels need to be disposed for each pixel, thereby reducing a quantity of subpixels.

In a possible implementation, the display further includes a thin film package layer, and the thin film package layer is disposed above the second electrode and covers the second electrode; or the display further includes a light shielding layer, and the light shielding layer is disposed above the driver circuit backplane and covers the first electrode layer; or the vertical type micro LED component includes an n-doped layer and a p-doped layer, the n-doped layer is connected to the top electrode of the vertical type micro LED component, and the p-doped layer is connected to the bottom electrode of the vertical type micro LED component; or the first electrode layer is an opaque electrode layer, and the second electrode layer is a transparent electrode layer; or the vertical type micro LED component is connected to the first electrode layer through bonding.

According to a fourth aspect, this application provides an electronic device, including a display and a battery. The display includes: a substrate, configured to carry components of the display; a driver circuit backplane, including a plurality of driver circuit units, where the driver circuit backplane is disposed above the substrate and is coupled to the battery; a first pixel layer, including a plurality of pixels, where each pixel of the first pixel layer includes a plurality of subpixels, each subpixel of the first pixel layer includes one organic light-emitting diode OLED component, the first pixel layer is disposed above the driver circuit backplane, and the OLED component of each subpixel of the first pixel layer is connected to at least one driver circuit unit in the driver circuit backplane; and a second pixel layer, including a plurality of pixels, where each pixel of the second pixel layer includes a plurality of subpixels, each subpixel of the second pixel layer includes one micro light-emitting diode micro LED component, the second pixel layer is disposed above the driver circuit backplane and surrounds the first pixel layer, an area of the second pixel layer is less than that of the first pixel layer, and the micro LED component of each subpixel of the second pixel layer is connected to at least one driver circuit unit in the driver circuit backplane.

The driver circuit backplane is coupled to the battery. This is conducive to narrowing down a non-display region of the display.

In a possible implementation, the micro LED component is a flip-type micro LED component, the flip-type micro LED component includes a P electrode and an N electrode, and the P electrode and the N electrode are located on a same side of the flip-type micro LED component. In this way, the P electrode and the N electrode are located at a same layer and can be fabricated together.

In a possible implementation, the P electrode or the N electrode of the flip-type micro LED component is connected to at least one driver circuit unit.

In a possible implementation, the display further includes a thin film package layer, and the thin film package layer covers the first pixel layer and the second pixel layer. In this way, the thin film package layer is flexible, so that flexibility of the display can be kept.

In a possible implementation, the driver circuit unit is a 2T1C driver circuit unit or a 5T1C driver circuit unit. In this way, the 5T1C driver circuit unit can make the flip-type micro LED component emit light more stably and evenly.

With reference to the fourth aspect, the driver circuit unit may be a 4T2C driver circuit unit.

In a possible implementation, a driver circuit unit of the flip-type micro LED component is connected to a negative voltage of the battery, and the P electrode of the flip-type micro LED component is connected to a positive voltage of the battery. In this way, the P electrode and the first pixel layer can share a circuit that provides the positive voltage.

In a possible implementation, a subpixel arrangement manner of the second pixel layer is a Pentile arrangement or a Bayer arrangement. In this way, only two subpixels need to be disposed for each pixel, thereby reducing a quantity of subpixels.

In a possible implementation, the flip-type micro LED component is connected to the driver circuit unit through bonding; or the thin film package layer includes a first inorganic package layer, a second organic package layer, and a third inorganic package layer; or the display further includes a passivation layer, and the passivation layer is disposed above the driver circuit backplane and below the first pixel layer and the second pixel layer; or the display further includes a planarization layer, and the planarization layer is disposed above the driver circuit backplane and below the first pixel layer and the second pixel layer; or the display further includes a light shielding layer, and the light shielding layer is disposed above the driver circuit backplane and covers the first electrode layer; or the first electrode layer and the second electrode layer are opaque electrode layers.

According to a fifth aspect, an embodiment of this application provides a display fabrication method, including: providing a substrate; fabricating a driver circuit backplane on the substrate, where the driver circuit backplane includes a plurality of driver units and an electrode layer; fabricating a first pixel layer above a region that is on the driver circuit backplane and that includes the driver units, where the first pixel layer includes an organic light-emitting diode OLED component; and fabricating a second pixel layer above a region that is on the driver circuit backplane and that includes the electrode layer, where the second pixel layer includes a micro light-emitting diode micro LED component, the second pixel layer surrounds the first pixel layer, and an area of the second pixel layer is less than that of the first pixel layer. In this way, the electrode layer can be fabricated by using a fabrication process of the driver circuit backplane, thereby simplifying a fabrication process of the display.

BRIEF DESCRIPTION OF DRAWINGS

FIG. 7 is a schematic diagram of a micro LED component according to an embodiment of this application;

FIG. 8A is a schematic diagram of a subpixel arrangement manner according to an embodiment of this application;

DESCRIPTION OF EMBODIMENTS

Figure 1A:
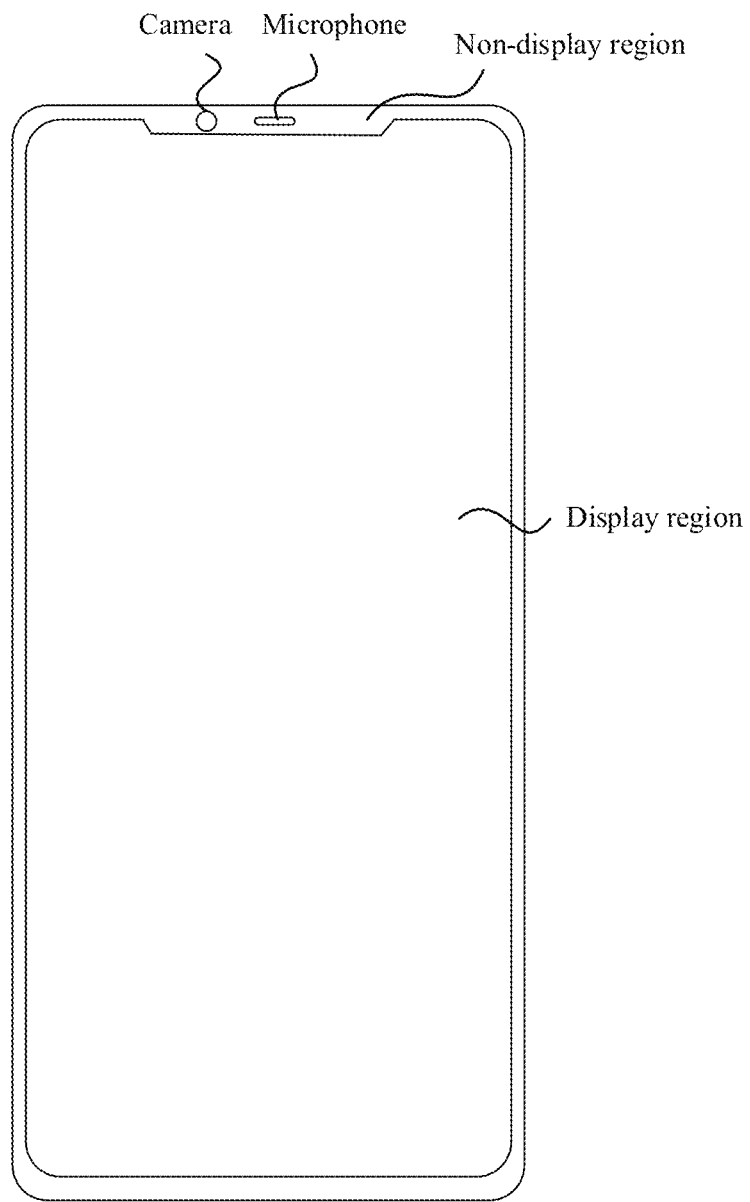
FIG. 1A is a schematic diagram of a front face of a mobile phone using an AMOLED display.

The technical solutions according to the embodiments of this application are clearly and completely described in the following with reference to the accompanying drawings.

Terms used in the embodiments of this application are merely intended to describe specific embodiments, but are not intended to limit this application. The terms "one", "a", "the", "the foregoing", and "this" of singular forms used in this specification and the appended claims of this application are also intended to include plural forms, unless otherwise specified in the context clearly. Terms "above", "between", and "on" used in this specification may indicate a position of a layer relative to another layer. "Above or on another layer, or bonded to another layer" may mean direct contact with the another layer, or may mean that there are one or more intermediate layers. That a layer is "between" a plurality of layers may mean that the layer is in direct contact with the plurality of layers, or may mean that there are one or more intermediate layers.

The embodiments are described with reference to the accompanying drawings. However, some embodiments may be implemented without one or more of these specific details, or may be implemented in combination with other known methods and configurations. In some cases, well-known semiconductor processes and fabrication technologies are not detailed particularly, to avoid obscuring this application.

A display described in the embodiments of this application can be applied to various electronic devices, such as a mobile phone, a tablet computer, a desktop computer, a laptop computer, a notebook computer, an ultra-mobile personal computer (Ultra-mobile Personal Computer, UMPC), a handheld computer, a netbook, a personal digital assistant (Personal Digital Assistant, PDA), a wearable electronic device, and a virtual reality device.

A pixel is a basic image display unit. Pixels described in the embodiments of this application include a virtual pixel and a physical pixel. The virtual pixel refers to a conceptual color block and is a smallest complete color block in image display. The physical pixel refers to a subpixel group including subpixels. Based on different display technologies, one subpixel group may include two subpixels, three subpixels, or four subpixels. One physical pixel may separately display one virtual pixel, or may display one virtual pixel in combination with another subpixel or physical pixel. Unless otherwise specified particularly, a pixel in the embodiments of this application is a physical pixel.

For example, one micro LED physical pixel may include three subpixels, for example, one micro LED component that emits red light, one micro LED component that emits blue light, and one micro LED component that emits green light. The three micro LED components form one physical pixel. Such a physical pixel may separately display one virtual pixel. For example, when the three micro LED components emit light at the same time, the micro LED component that emits red light, the micro LED component that emits blue light, and the micro LED component that emits green light emit red light, blue light, and green light, respectively. In this way, one white virtual pixel can be displayed.

In some other embodiments, one micro LED physical pixel may include two subpixels. For example, the two subpixels may be a blue subpixel and a green subpixel, or may be a red subpixel and a green subpixel. Such a physical pixel may display one virtual pixel by using one subpixel of an adjacent physical pixel. For example, if one physical pixel includes a blue subpixel and a green subpixel, during display of one virtual pixel, a red subpixel in an adjacent physical pixel may be used to display the virtual pixel.

In the embodiments of this application, a subpixel drive manner includes passive drive (Passive Matrix) and active drive (Active Matrix). If an OLED display uses an active drive manner, the OLED display may be referred to as an AMOLED display. If an OLED display uses a passive drive manner, the OLED display may be referred to as a PMOLED display. The passive drive is also referred to as passive drive. A cathode and an anode form a matrix, subpixels in the array are lit up in a scan mode, and the subpixels are lit up instantaneously during each scanning. The passive drive has an advantage of a simple structure, and therefore can effectively reduce fabrication costs. However, the passive drive has a disadvantage of a low response speed. Therefore, it is difficult to apply the passive drive to a medium-sized or large-sized display. In addition, the passive drive shortens lifetimes of the subpixels. The active drive manner is also referred to as an active drive manner, and means that a TFT driver circuit is used to control a single pixel to emit light. The active drive manner has advantages of a low required drive voltage and long lifetimes of subpixels, but has disadvantages of a complex fabrication process and relatively high costs.

FIG. 1A is a plan view of a front face of a mobile phone using an AMOLED display. Referring to FIG. 1A, the front face of the mobile phone may include a display region and a non-display region. The display region is a region in which a picture can be displayed, and the non-display region is a region in which no picture can be displayed. A camera and a microphone may be placed in the non-display region. With the development of a concept of a full screen, a ratio of an area of the display region on the front face of the mobile phone to an area of the front face of the mobile phone is increasing. However, because an OLED organic light-emitting material used for the AMOLED display is a hydrophilic organic material, when the OLED organic light-emitting material comes into contact with water vapor and oxygen gas, an irreversible photooxidation reaction occurs. This affects display performance of the OLED organic light-emitting material. In addition, water vapor and oxygen gas have quite strong erosion effects on electrode materials such as aluminum, magnesium, and silver commonly used for the AMOLED display. Therefore, the AMOLED display imposes an extremely high requirement for isolating external water vapor and oxygen gas. In the prior art, an AMOLED display is provided with a bezel region with a specific width to isolate external water vapor and oxygen gas. The bezel region is provided for a package design used for isolating water vapor and oxygen gas, for example, a design of a TFE thin film package layer. The package design used in the bezel region in the prior art cannot implement placement of an OLED pixel. Therefore, no picture can be displayed in the bezel region. Even if a front face of a mobile phone is fully covered with the AMOLED display, there is still a non-display region with a relatively large area.

The following describes an example electronic device applicable to the following embodiments of this application.

Figure 1B:
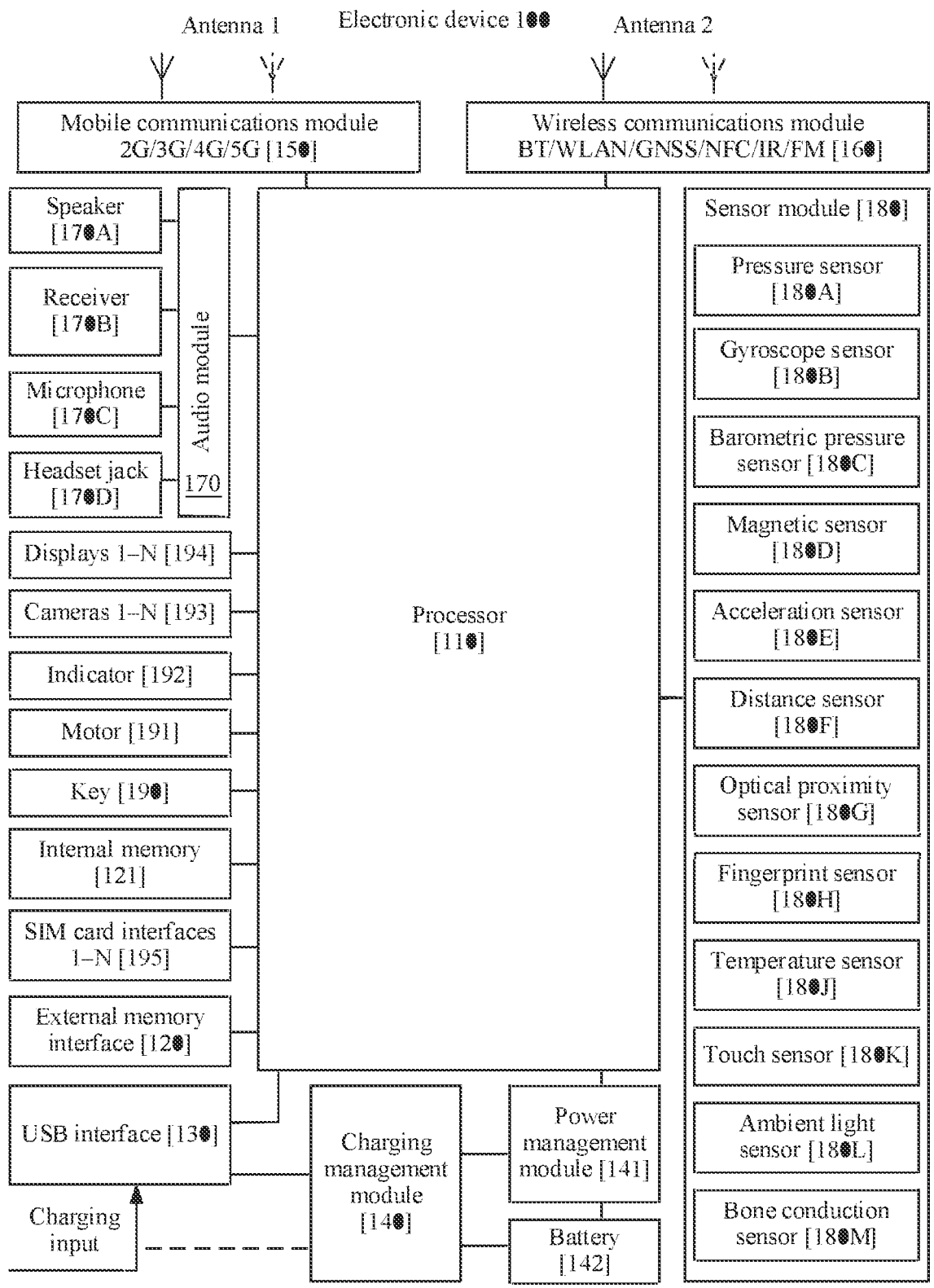
FIG. 1B is a structural diagram of an electronic device according to an embodiment of this application.

FIG. 1B is a schematic structural diagram of an electronic device 100.

The electronic device 100 may include a processor 110, an external memory interface 120, an internal memory 121, a universal serial bus (universal serial bus, USB) port 130, a charging management module 140, a power management unit 141, a battery 142, an antenna 1, an antenna 2, a mobile communications module 150, a wireless communications module 160, an audio module 170, a speaker 170A, a receiver 170B, a microphone 170C, a headset jack 170D, a sensor module 180, a key 190, a motor 191, an indicator 192, a camera 193, a display 194, a subscriber identity module (subscriber identification module, SIM) card interface 195, and the like. The sensor module 180 may include a pressure sensor 180A, a gyroscope sensor 180B, a barometric pressure sensor 180C, a magnetic sensor 180D, an acceleration sensor 180E, a distance sensor 180F, an optical proximity sensor 180G, a fingerprint sensor 180H, a temperature sensor 180J, a touch sensor 180K, an ambient light sensor 180L, a bone conduction sensor 180M, and the like.

It may be understood that an example structure in this embodiment of this application does not constitute a specific limitation on the electronic device 100. In some other embodiments of this application, the electronic device 100 may include more or fewer components than those shown in the figure, or some components may be combined, or some components may be split, or there may be a different component layout. The components shown in the figure may be implemented by hardware, software, or a combination of software and hardware.

The processor 110 may include one or more processing units. For example, the processor 110 may include an application processor (application processor, AP), a modem processor, a graphics processing unit (graphics processing unit, GPU), an image signal processor (image signal processor, ISP), a controller, a memory, a video codec, a digital signal processor (digital signal processor, DSP), a baseband processor, a neural-network processing unit (neural-network processing unit, NPU), and/or the like. Different processing units may be independent devices, or may be integrated into one or more processors.

The controller may be a nerve center and a command center of the electronic device 100. The controller may generate an operation control signal based on instruction operation code and a time sequence signal, to complete control of instruction reading and instruction execution.

The memory may further be disposed in the processor 110, and is configured to store instructions and data. In some embodiments, the memory in the processor 110 is a cache. The memory may store instructions or data just used or cyclically used by the processor 110. If the processor 110 needs to use the instructions or the data again, the processor 110 may directly invoke the instructions or the data from the memory. This avoids repeated access and reduces a waiting time of the processor 110, thereby improving system efficiency.

In some embodiments, the processor 110 may include one or more interfaces. The interface may include an inter-integrated circuit (inter-integrated circuit, I2C) interface, an inter-integrated circuit sound (inter-integrated circuit sound, I2S) interface, a pulse code modulation (pulse code modulation, PCM) interface, a universal asynchronous receiver/transmitter (universal asynchronous receiver/transmitter, UART) interface, a mobile industry processor interface (mobile industry processor interface, MIPI), a general-purpose input/output (general-purpose input/output, GPIO) interface, a subscriber identity module (subscriber identity module, SIM) interface, a universal serial bus (universal serial bus, USB) port, and/or the like.

It may be understood that an interface connection relationship between modules illustrated in this embodiment of this application is merely an example for description, and does not constitute a limitation on the structure of the electronic device 100. In some other embodiments of this application, the electronic device 100 may alternatively use an interface connection mode different from that in the foregoing embodiment, or use a combination of a plurality of interface connection modes.

The charging management module 140 is configured to receive a charging input from the charger. The charger may be a wireless charger or a wired charger. In some embodiments of wired charging, the charging management module 140 may receive a charging input from a wired charger through the USB interface 130. In some embodiments of wireless charging, the charging management module 140 may receive a wireless charging input by using a wireless charging coil of the electronic device 100. The charging management module 140 supplies power to the electronic device by using the power management unit 141 while charging the battery 142.

The power management module 141 is configured to connect the battery 142, the charging management module 140, and the processor 110. The power management unit 141 receives an input from the battery 142 and/or the charging management module 140, and supplies power to the processor 110, the internal memory 121, an external memory, the display 194, the camera 193, the wireless communications module 160, and the like. The power management module 141 may further be configured to monitor parameters such as a battery capacity, a quantity of battery cycles, and a battery health status (electric leakage or impedance). In some other embodiments, the power management unit 141 may alternatively be disposed in the processor 110. In some other embodiments, the power management unit 141 and the charging management module 140 may alternatively be disposed in a same device.

A wireless communication function of the electronic device 100 may be implemented by using the antenna 1, the antenna 2, the mobile communications module 150, the wireless communications module 160, the modem processor, the baseband processor, and the like.

The antenna 1 and the antenna 2 are configured to transmit and receive electromagnetic wave signals. Each antenna in the electronic device 100 may be configured to cover one or more communication bands. Different antennas may further be multiplexed, to improve antenna utilization. For example, the antenna 1 may be multiplexed as a diversity antenna of a wireless local area network. In some other embodiments, the antenna may be used in combination with a tuning switch.

The mobile communications module 150 may provide a wireless communication solution that includes 2G/3G/4G/5G or the like and that is applied to the electronic device 100. The mobile communications module 150 may include at least one filter, a switch, a power amplifier, a low noise amplifier (low noise amplifier, LNA), and the like. The mobile communications module 150 may receive an electromagnetic wave through the antenna 1, perform processing such as filtering or amplification on the received electromagnetic wave, and transmit a processed electromagnetic wave to the modem processor for demodulation. The mobile communications module 150 may further amplify a signal modulated by the modem processor, and convert the signal into an electromagnetic wave for radiation through the antenna 1. In some embodiments, at least some function modules of the mobile communications module 150 may be disposed in the processor 110. In some embodiments, at least some function modules of the mobile communications module 150 and at least some modules of the processor 110 may be disposed in a same device.

The modem processor may include a modulator and a demodulator. In some embodiments, the modem processor may be an independent component. In some other embodiments, the modem processor may be independent of the processor 110, and is disposed in a same device as the mobile communications module 150 or another function module.

The wireless communications module 160 may provide a wireless communication solution that includes a wireless local area network (wireless local area networks, WLAN) (for example, a wireless fidelity (wireless fidelity, Wi-Fi) network), Bluetooth (Bluetooth, BT), a global navigation satellite system (global navigation satellite system, GNSS), frequency modulation (frequency modulation, FM), a near field communication (near field communication, NFC) technology, an infrared (infrared, IR) technology, or the like and that is applied to the electronic device 100. The wireless communications module 160 may be one or more devices that integrate at least one communications processing module. The wireless communications module 160 receives an electromagnetic wave through the antenna 2, performs frequency modulation and filtering on an electromagnetic wave signal, and sends a processed signal to the processor 110. The wireless communications module 160 may further receive a to-be-sent signal from the processor 110, perform frequency modulation and amplification on the signal, and convert the signal into an electromagnetic wave for radiation through the antenna 2.

In some embodiments, the antenna 1 and the mobile communications module 150 in the electronic device 100 are coupled, and the antenna 2 and the wireless communications module 160 in the electronic device 100 are coupled, so that the electronic device 100 can communicate with a network and another device by using a wireless communications technology. The wireless communications technology may include a global system for mobile communications (global system for mobile communications, GSM), a general packet radio service (general packet radio service, GPRS), code division multiple access (code division multiple access, CDMA), wideband code division multiple access (wideband code division multiple access, WCDMA), time-division code division multiple access (time-division code division multiple access, TD-SCDMA), long term evolution (long term evolution, LTE), BT, a GNSS, a WLAN, NFC, FM, an IR technology, and/or the like. The GNSS may include a global positioning system (global positioning system, GPS), a global navigation satellite system (global navigation satellite system, GLONASS), a BeiDou navigation satellite system (BeiDou navigation satellite system, BDS), a quasi-zenith satellite system (quasi-zenith satellite system, QZSS), and/or a satellite-based augmentation system (satellite based augmentation systems, SBAS).

The electronic device 100 implements a display function by using the GPU, the display 194, the application processor, and the like. The GPU is a microprocessor for image processing, and is connected to the display 194 and the application processor. The GPU is configured to perform mathematical and geometric calculation, and render an image. The processor 110 may include one or more GPUs that execute program instructions to generate or change display information.

The display 194 is configured to display an image, a video, and the like. The display 194 includes a display panel. A liquid crystal display (liquid crystal display, LCD), an organic light-emitting diode (organic light-emitting diode, OLED), an active-matrix organic light emitting diode (active-matrix organic light emitting diode, AMOLED), a flexible light-emitting diode (flex light-emitting diode, FLED), a mini-LED, a micro light-emitting diode micro LED, a micro-OLED, quantum dot light emitting diodes (quantum dot light emitting diodes, QLED), or the like may be used for the display panel. In some embodiments, the electronic device 100 may include one or N displays 194, where N is a positive integer greater than 1.

The electronic device 100 can implement a shooting function by using the ISP, the camera 193, the video codec, the GPU, the display 194, the application processor, and the like.

The ISP is configured to process data fed back by the camera 193. For example, during shooting, a shutter is pressed, light is transmitted to a photosensitive element of the camera through a lens, an optical signal is converted into an electrical signal, and the photosensitive element of the camera transmits the electrical signal to the ISP for processing, to convert the electrical signal into a visible image. The ISP may further perform algorithm optimization on noise, brightness, and complexion of the image. The ISP may further optimize parameters such as exposure and a color temperature of a shooting scenario. In some embodiments, the ISP may be disposed in the camera 193.

The camera 193 is configured to capture a static image or a video. An optical image of an object is generated through the lens, and is projected onto the photosensitive element. The photosensitive element may be a charge coupled device (charge coupled device, CCD) or a complementary metal-oxide-semiconductor (complementary metal-oxide-semiconductor, CMOS) photoelectric transistor. The photosensitive element converts an optical signal into an electrical signal, and then transmits the electrical signal to the ISP to convert the electrical signal into a digital image signal. The ISP outputs the digital image signal to the DSP for processing. The DSP converts the digital image signal into a standard image signal in an RGB format, a YUV format, or the like. In some embodiments, the electronic device 100 may include one or N cameras 193, where N is a positive integer greater than 1.

The digital signal processor is configured to process a digital signal, and may further process another digital signal in addition to a digital image signal. For example, when the electronic device 100 selects a frequency, the digital signal processor is configured to perform Fourier transform and the like on frequency energy.

The video codec is configured to compress or decompress a digital video. The electronic device 100 may support one or more types of video codecs. In this way, the electronic device 100 can play or record videos in a plurality of encoding formats, for example, moving picture experts group (moving picture experts group, MPEG)-1, MPEG-2, MPEG-3, MPEG-4, and the like.

The NPU is a neural-network (neural-network, NN) computing processor. The NPU quickly processes input information by referring to a structure of a biological neural network, for example, by referring to a mode of transmission between human brain neurons, and may further continuously perform self-learning. Applications such as intelligent cognition of the electronic device 100, for example, image recognition, facial recognition, speech recognition, and text understanding, can be implemented by using the NPU.

The external memory interface 120 may be configured to connect to an external storage card, for example, a micro SD card, to extend a storage capability of the electronic device 100. The external storage card communicates with the processor 110 through the external memory interface 120, to implement a data storage function. For example, files such as music and a video are stored in the external memory card.

The internal memory 121 may be configured to store computer-executable program code. The executable program code includes instructions. The processor 110 runs the instructions stored in the internal memory 121 to perform various function applications of the electronic device 100 and process data. The internal memory 121 may include a program storage area and a data storage area. The program storage area may store an operating system, an application required by at least one function (for example, a sound playing function or an image playing function), and the like. The data storage area may store data (such as audio data and a phone book) created when the electronic device 100 is used, and the like. In addition, the internal memory 121 may include a high-speed random access memory, and may further include a nonvolatile memory, for example, at least one magnetic disk storage device, a flash memory device, or a universal flash storage (universal flash storage, UFS).

The electronic device 100 may implement audio functions, for example, music playback and recording, by using the audio module 170, the speaker 170A, the receiver 170B, the microphone 170C, the headset jack 170D, the application processor, and the like.

The audio module 170 is configured to convert digital audio information into an analog audio signal output, and is further configured to convert an analog audio input into a digital audio signal. The audio module 170 may further be configured to code and decode an audio signal. In some embodiments, the audio module 170 may be disposed in the processor 110, or some function modules of the audio module 170 are disposed in the processor 110.

The speaker 170A, also referred to as a "horn", is configured to convert an audio electrical signal into a sound signal. The electronic device 100 may be configured to listen to music or answer a hands-free call by using the speaker 170A.

The receiver 170B, also referred to as an "earpiece", is configured to convert an audio electrical signal into a sound signal. When a call is answered or voice information is received by using the electronic device 100, the receiver 170B may be put close to a human ear to receive a voice.

The microphone 170C, also referred to as a "mike" or a "microphone", is configured to convert a sound signal into an electrical signal. When making a call or sending voice information, the user may make a sound near the microphone 170C through the mouth of the user, to input a sound signal to the microphone 170C. At least one microphone 170C may be disposed in the electronic device 100. In some other embodiments, two microphones 170C may be disposed in the electronic device 100, to implement a noise reduction function, in addition to collecting a sound signal. In some other embodiments, three, four, or more microphones 170C may alternatively be disposed in the electronic device 100, to collect a sound signal and reduce noise. The microphones may further identify a sound source, to implement a directional recording function, and the like.

The headset jack 170D is configured to connect to a wired headset. The headset jack 170D may be the USB interface 130 or a 3.5 mm open mobile terminal platform (open mobile terminal platform, OMTP) standard interface or cellular telecommunications industry association of the USA (cellular telecommunications industry association of the USA, CTIA) standard interface.

The pressure sensor 180A is configured to sense a pressure signal, and can convert the pressure signal into an electrical signal. In some embodiments, the pressure sensor 180A may be disposed on the display 194. There is a plurality of types of pressure sensors 180A, such as a resistive pressure sensor, an inductive pressure sensor, and a capacitive pressure sensor. The capacitive pressure sensor may include at least two parallel plates made of conductive materials. When a force is applied to the pressure sensor 180A, capacitance between electrodes changes. The electronic device 100 determines pressure strength based on a capacitance change. When a touch operation is performed on the display 194, the electronic device 100 detects intensity of the touch operation by using the pressure sensor 180A. The electronic device 100 may also calculate a touch location based on a detection signal of the pressure sensor 180A. In some embodiments, touch operations that are performed at a same touch location but have different touch operation intensity may correspond to different operation instructions. For example, when a touch operation whose touch operation intensity is less than a first pressure threshold is performed on an SMS message application icon, an instruction for viewing an SMS message is executed. When a touch operation whose touch operation intensity is greater than or equal to the first pressure threshold is performed on the SMS message application icon, an instruction for creating a new SMS message is executed.

The gyroscope sensor 180B may be configured to determine a motion posture of the electronic device 100.

The barometric pressure sensor 180C is configured to measure barometric pressure.

The magnetic sensor 180D includes a Hall sensor.

The acceleration sensor 180E may detect accelerations in various directions (usually on three axes) of the electronic device 100, and may detect magnitude and a direction of gravity when the electronic device 100 is still. The acceleration sensor 180E may be further configured to identify a posture of the electronic device, and is applied to an application such as switching between landscape mode and portrait mode or a pedometer.

The distance sensor 180F is configured to measure a distance.

The optical proximity sensor 180G may include, for example, a light-emitting diode (LED) and an optical detector, for example, a photodiode.

The ambient light sensor 180L is configured to sense ambient light brightness.

The fingerprint sensor 180H is configured to collect a fingerprint. The electronic device 100 may use a feature of the collected fingerprint to implement fingerprint-based unlocking, application lock access, fingerprint-based photographing, fingerprint-based call answering, and the like.

The temperature sensor 180J is configured to detect a temperature. In some embodiments, the electronic device 100 executes a temperature processing policy based on the temperature detected by the temperature sensor 180J.

The touch sensor 180K is also referred to as a "touch panel". The touch sensor 180K may be disposed on the display 194, and the touch sensor 180K and the display 194 form a touchscreen, which is also referred to as a "touch screen". The touch sensor 180K is configured to detect a touch operation performed on or near the touch sensor 180K. The touch sensor may transfer the detected touch operation to the application processor, to determine a type of the touch event. A visual output related to the touch operation may be provided by using the display 194. In some other embodiments, the touch sensor 180K may alternatively be disposed on a surface of the electronic device 100 at a location different from that of the display 194.

The bone conduction sensor 180M may obtain a vibration signal. In some embodiments, the bone conduction sensor 180M may obtain a vibration signal of a vibration bone of a human vocal-cord part. The bone conduction sensor 180M may also be in contact with a human pulse, to receive a blood pressure beating signal. In some embodiments, the bone conduction sensor 180M may alternatively be disposed in a headset to form a bone conduction headset. The audio module 170 may obtain a voice signal through parsing based on the vibration signal that is of the vibration bone of the vocal-cord part and that is obtained by the bone conduction sensor 180M, to implement a voice function. The application processor may parse heart rate information based on the blood pressure beating signal obtained by the bone conduction sensor 180M, to implement a heart rate detection function.

The key 190 includes a power key, a volume key, and the like. The key 190 may be a mechanical button, or may be a touch-sensitive key. The electronic device 100 may receive a key input, and generate a key signal input related to user settings and function control of the electronic device 100.

The motor 191 may generate a vibration prompt. The motor 191 may be configured to provide an incoming call vibration prompt and a touch vibration feedback. For example, touch operations performed on different applications (for example, shooting and audio playing) may correspond to different vibration feedback effects. The motor 191 may also correspond to different vibration feedback effects for touch operations performed on different areas of the display 194. Different application scenarios (for example, a time reminder, information receiving, an alarm clock, a game) may also correspond to different vibration feedback effects. A touch vibration feedback effect may further be customized.

The indicator 192 may be an indicator light, and may be configured to indicate a charging status and a power change, or may be configured to indicate a message, a missed call, a notification, and the like.

The SIM card interface 195 is configured to connect to a SIM card. The SIM card may be inserted in the SIM card interface 195 or removed from the SIM card interface 195, to implement contact with or separation from the electronic device 100. The electronic device 100 may support one or N SIM card interfaces, where N is a positive integer greater than 1. The SIM card interface 195 may support a nano-SIM card, a micro-SIM card, a SIM card, and the like. A plurality of cards may be simultaneously inserted in a same SIM card interface 195. The plurality of cards may be of a same type or of different types. The SIM card interface 195 may also be compatible with different types of SIM cards. The SIM card interface 195 may further be compatible with an external memory card. The electronic device 100 interacts with a network through the SIM card, to implement functions such as calling and data communication. In some embodiments, the electronic device 100 uses an eSIM, namely, an embedded SIM card. The eSIM card may be embedded in the electronic device 100, and cannot be separated from the electronic device 100.

Figure 1C:
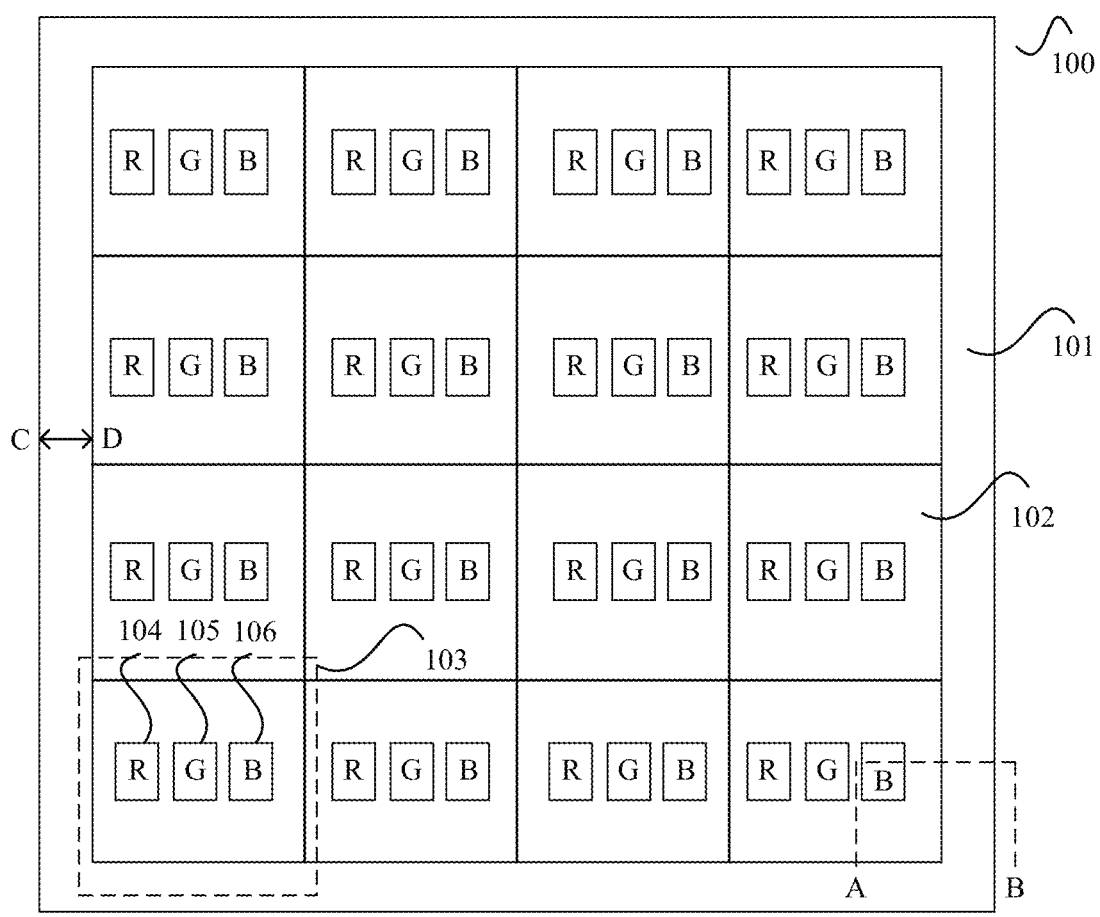
FIG. 1C is a plan view of an AMOLED display according to an embodiment of this application.

FIG. 1C is a plan view of an AMOLED display. Referring to FIG. 1C, the AMOLED display 200 includes a display region 102 and a bezel region 101. The bezel region 101 surrounds the display region 102. It should be noted that the bezel region 101 is located in the non-display region shown in FIG. 1A, and a ratio of an area of the bezel region 101 to an area of the non-display region is determined by technologies of different terminal manufacturers.

The display 200 may be flexible, bendable, or foldable. The display region 102 includes a plurality of pixels 103, and each pixel includes a plurality of subpixels. For example, the pixel 103 includes a subpixel 104, a subpixel 105, and a subpixel 106. The subpixel 104 may emit red light, the subpixel 105 may emit green light, and the subpixel 106 may emit blue light. It should be understood that subpixel arrangement in FIG. 1C is merely used as an example. The subpixels may alternatively be arranged in a Pentile arrangement manner. Each pixel includes only two subpixels. During light emission, a single pixel emits light by using one subpixel of an adjacent pixel.

Figure 2:
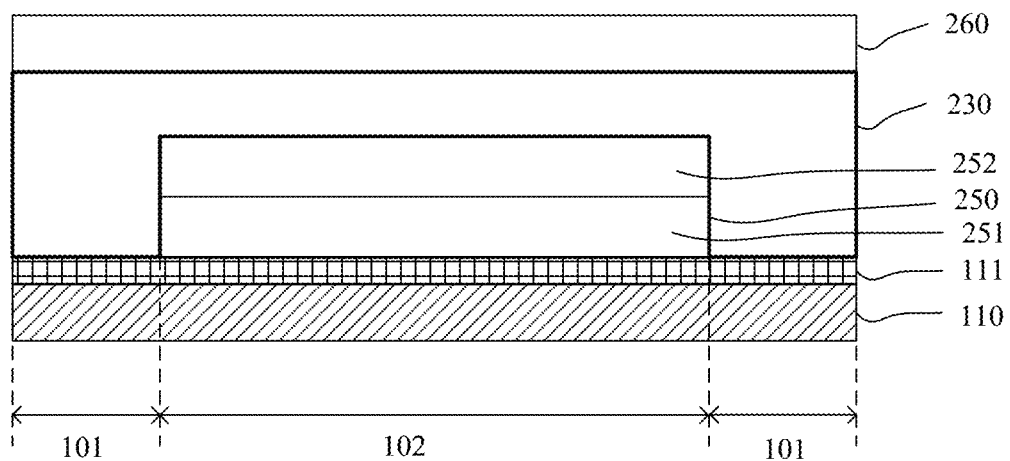
FIG. 2 is a cross-sectional side view of an AMOLED display according to an embodiment of this application.

FIG. 2 is a cross-sectional side view of the display 200. Referring to FIG. 2, the display 200 mainly includes a substrate 110, an AMOLED core layer 250, and a TFE package layer 230. The substrate 110 may be configured to carry components included in the display 200. The components may be various components of the display, such as a transistor, a capacitor, an electrode, an OLED component, and a micro LED component.

The substrate 110 includes the display region 102 and the bezel region 101. Optionally, a buffer layer 111 may be disposed on the substrate 110. The AMOLED core layer 250 may be disposed on the buffer layer 111, or may be directly disposed on the substrate 110. The TFE package layer 230 packages the AMOLED core layer 250. It should be noted that the TFE package layer 230 is merely used as an example, and is used to isolate external water vapor and oxygen gas. In the prior art, glass may alternatively be used to package the AMOLED core layer 250. Compared with the TFE package layer 230, a glass material has a better effect of isolating external water vapor and oxygen gas, but the glass material is difficult to freely fold or bend and is inapplicable to a foldable and bendable AMOLED display. In this embodiment of this application, the AMOLED display may use the TFE package layer 230, so that the AMOLED display becomes bendable and foldable.

The AMOLED core layer 250 includes a light-emitting frontplane (Front Plane) 252 and a driver circuit backplane (Back Plane) 251. The driver circuit backplane may also be referred to as a driver backplane. The light-emitting frontplane mainly includes subpixels made of an OLED organic light-emitting material. The driver circuit backplane mainly includes a TFT thin film transistor, and is used to drive the subpixels in the light-emitting frontplane to emit light. Optionally, the display 100 may further include a polarizer 260. The polarizer 260 is located above the TFE package layer 230, and can cancel reflected light generated after external light enters the AMOLED display. This reduces interference generated by reflection of the external light, and enhances a contrast of the display.

Figure 3A:
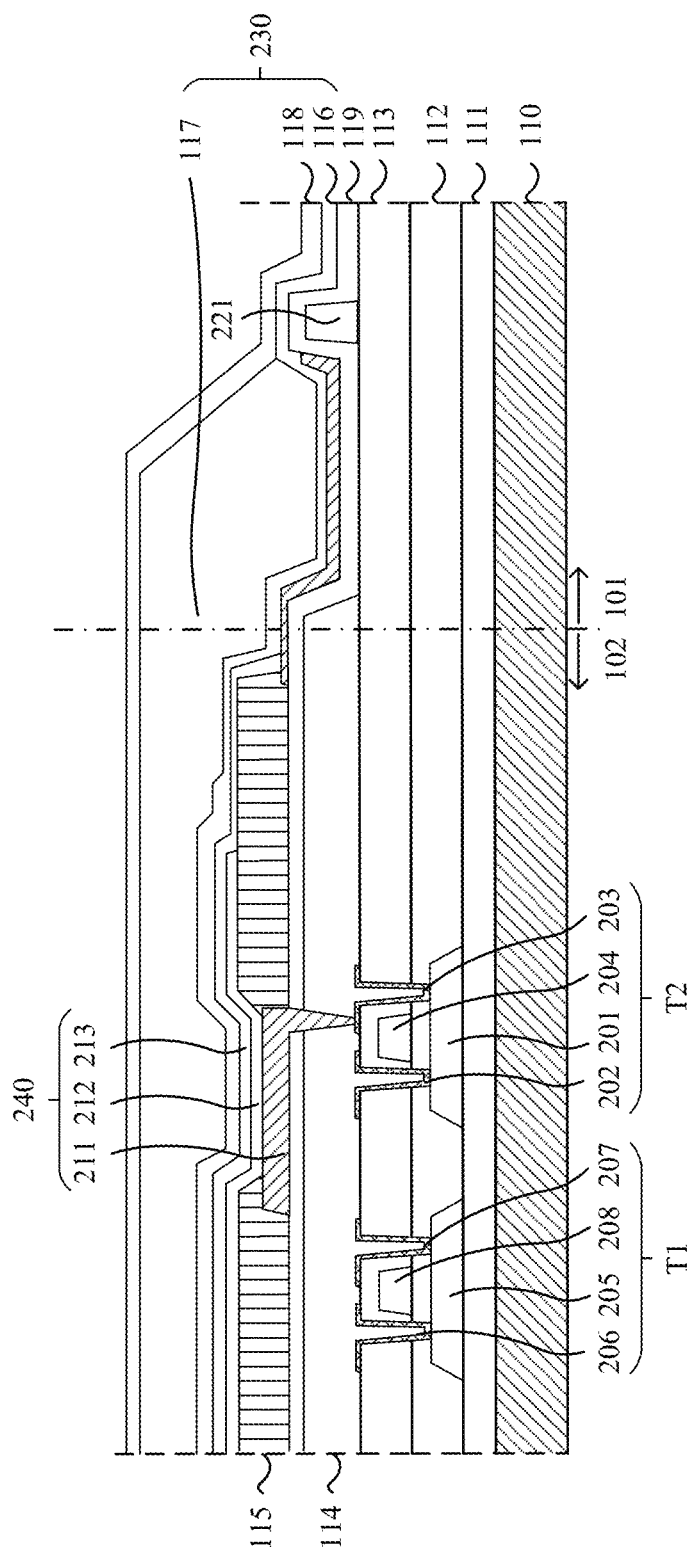
FIG. 3A is a cross-sectional view of the AMOLED display shown in FIG. 2.

FIG. 3A is a cross-sectional view obtained by cutting along a line A-B in FIG. 1C, and mainly includes a TFT package layer 230, a light-emitting frontplane 251, a driver circuit backplane 252, and a substrate 110. Referring to FIG. 3A, the substrate 110 may be made of a glass material or a plastic material, and has a basic function of supporting an AMOLED core layer 250. Optionally, a buffer layer 111 may be disposed on the substrate 110. The buffer layer 111 can reduce or prevent penetration of a foreign material, water vapor, or oxygen gas into the light-emitting frontplane and the driver circuit backplane, to protect a TFT thin film transistor, and can also provide a flat surface for the substrate 110. The buffer layer 111 may be made of an inorganic material such as silicon oxide or silicon nitride. The buffer layer 111 may be formed by a plurality of layers obtained by alternately stacking one or more inorganic layers.

A more detailed structure of the driver circuit backplane 251 shown in FIG. 2 can be presented in a partial cross-sectional view shown in FIG. 3A. The driver circuit backplane 251 may include a gate insulation layer 112, an insulation interlayer (an insulating interlayer) 113, and a plurality of TFT driver circuits. Each TFT driver circuit may include one or more transistors T and one or more capacitors C, and is used to control a single subpixel in the AMOLED display to emit light, for example, control a subpixel 240 in FIG. 3A to emit light. For another example, a TFT driver circuit is provided below each subpixel shown in FIG. 1C.

The cross-sectional view shown in FIG. 3A includes a specific structure of the driver circuit backplane 251. As shown in FIG. 3A, a transistor T1 includes a semiconductor layer 205, a gate electrode 208, a source electrode 206, and a drain electrode 207. Similarly, a transistor T2 includes a semiconductor layer 201, a gate electrode 204, a source electrode 202, and a drain electrode 203. A semiconductor layer in a transistor may be made of low-temperature polycrystalline silicon (p-Si) or amorphous silicon (a-Si). A source electrode, a drain electrode, and a gate electrode each may be formed by one of molybdenum (Mo), aluminum (Al), chromium (Cr), gold (Au), titanium (Ti), nickel (Ni), neodymium (Nd), and copper (Cu) or a single layer or a plurality of layers of an alloy thereof.

The gate insulation layer 112 may be disposed on a semiconductor layer. For example, the gate insulation layer shown in FIG. 3A covers the semiconductor layer 205 and the semiconductor layer 201. The gate insulation layer 112 may be made of a material such as silicon oxide, silicon nitride, or silicon oxynitride.

The insulation interlayer 113 may be disposed on a gate electrode. For example, the insulation interlayer 113 covers the gate electrode 204 and the gate electrode 208. The insulation interlayer 113 may be made of a material such as silicon oxide or silicon nitride. As shown in FIG. 3A, using the transistor T2 as an example, the source electrode 202 and the drain electrode 203 of the transistor T2 may be disposed on the gate insulation layer 112, and are in contact with the semiconductor layer 201 through contact holes formed by removing parts of the gate insulation layer 112 and the insulation interlayer 113.

The TFT driver circuit in the driver circuit backplane may be of a plurality of structures. For example, the AMOLED display shown in FIG. 3A may use a TFT driver circuit of a conventional 2T1C structure. To be specific, each TFT driver circuit includes two transistors and one capacitor. One of the transistors is used as a switching transistor to control whether a current enters the driver circuit; and the other transistor is used as a driver transistor, is connected to a voltage of a power source, and provides a stable current for a subpixel in a specific time period. The capacitor is used to store a voltage, and ensures, after each scanning is completed, that the driver transistor provides a stable current for the subpixel in a specific time period.

Figure 4:
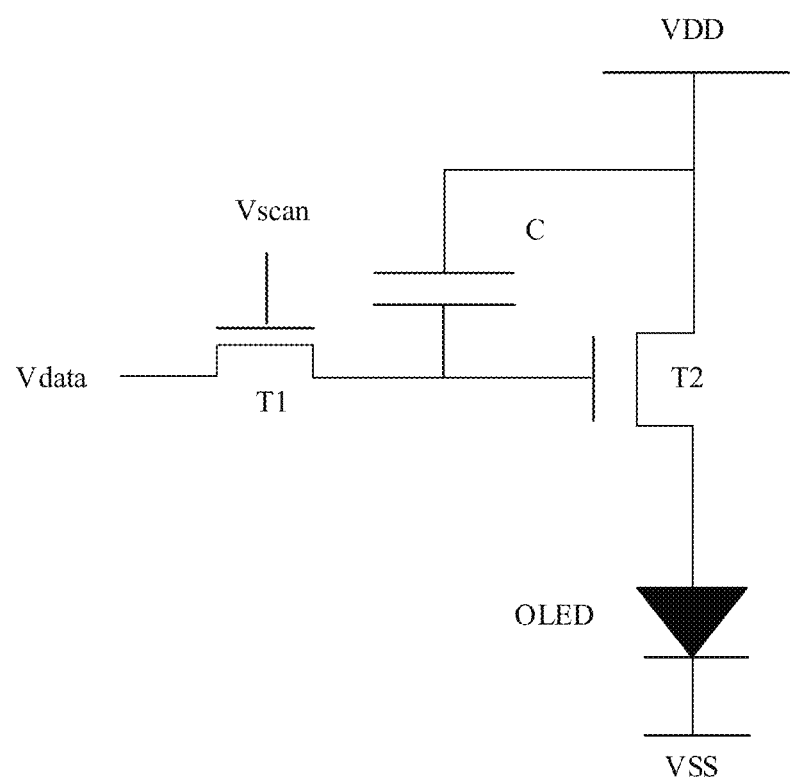
FIG. 4 is a schematic diagram of a pixel driver circuit according to an embodiment of this application.

For example, the transistors T1 and T2 shown in FIG. 3A and one capacitor C (not shown in FIG. 3A) may form a TFT driver circuit of a 2T1C structure to drive a subpixel to emit light. FIG. 4 is a logic circuit diagram corresponding to the TFT driver circuit in FIG. 3A. T1 may be a switching transistor, and T2 may be a driver transistor. The gate electrode 208 of T1 shown in FIG. 3A is connected to a scan signal Vscan shown in FIG. 4. The source electrode 206 of T1 shown in FIG. 3A is connected to a data signal Vdata shown in FIG. 4. The drain electrode 207 of T1 shown in FIG. 3A is connected to the gate electrode 204 of T2 and one end of the capacitor C shown in FIG. 4.

The source electrode 202 of T2 shown in FIG. 3A is connected to a positive voltage VDD of a power source shown in FIG. 4, and is in contact with the other end of the capacitor C. The drain electrode 203 of T2 shown in FIG. 3A is connected to one electrode of a subpixel 240 shown in FIG. 4. The other electrode of the subpixel 240 is connected to a negative voltage VSS of the power source, and the negative voltage VSS can be provided for all subpixels.

An OLED subpixel emits light in a current drive manner. To be specific, when a current passes through the subpixel, the subpixel can emit light. Therefore, whether the subpixel emits light and light-emitting intensity may be controlled by controlling the current passing through the subpixel. Specifically, a driver chip of the AMOLED display sends a scan signal Vscan at intervals to search for a subpixel that is expected to emit light. When T1 receives the scan signal Vscan, the transistor T1 is turned on. Therefore, a data signal Vdata is allowed to be transmitted to the gate electrode of T2. After T2 receives the data signal Vdata, the transistor T2 is turned on, so that a current is allowed to reach a subpixel, and the subpixel starts to emit light. Because the scan signal Vscan changes from a high level to a low level in a scanning cycle, the transistor T1 is turned off, and Vdata cannot be transmitted to the gate electrode of the transistor T2. Therefore, to ensure that the transistor T2 can continuously receive the data signal Vdata, the subpixel is made to continuously emit light until a next scanning cycle of the Vscan arrives. The capacitor C is used to store the data signal Vdata at the gate electrode of T2 to ensure that the subpixel can continuously emit light in the current scanning cycle.

It should be noted that the 2T1C driver circuit described in this embodiment of this application is merely used as an example, and another type of circuit structure and another type of transistor structure may also be applicable, for example, a low-gate transistor or a more complex compensation circuit design. For example, during a fabrication process of the AMOLED display, TFT transistors at different positions may have different performance. This may cause a difference in brightness display. Therefore, the AMOLED display may alternatively use a structure such as 7T1C, 6T1C, or 5T2C, to compensate for instability or a performance difference of the 2T1C structure caused by the process.

The light-emitting frontplane 252 shown in FIG. 2 may be disposed on the gate insulation layer 112 shown in FIG. 3A. As shown in FIG. 3A, the light-emitting frontplane may include a planarization layer 114, a passivation layer 119, the subpixel 240, and a pixel definition layer 115.

The planarization layer 114 may be disposed on a source electrode and a drain electrode, to protect a transistor and provide a flat surface. In some embodiments, a passivation layer (not shown in the figure) may be disposed on the source electrode and the drain electrode, the passivation layer may be used to isolate the source electrode and the drain electrode, and the planarization layer 114 may be disposed on the passivation layer.

The planarization layer 114 may include an organic compound such as organic glass (polymethyl methacrylate) or an inorganic substance such as a silicon compound or metal oxide. Optionally, the planarization layer 114 may cover the passivation layer 119, and the passivation layer 119 may be made of an inorganic insulating material such as silicon nitride (SiN$_x$), silicon oxide (SiO$_2$), methyl methacrylate (PMMA), or benzocyclobutene (BCB). The passivation layer 119 may further isolate water vapor and oxygen gas permeating from the substrate 110.

The pixel definition layer 115 may be processed by using a method such as dry etching, wet etching, or nanoimprint lithography, to form an opening. A width of the opening may be based on a resolution, a pixel density, and a subpixel density of the display. The opening may be in a shape of a concave structure, a longitudinal section of the opening is of a M-shaped structure or a dam structure, and a concave part of the longitudinal section is provided with a vertical or sloped side wall. In addition, a plurality of types of concave structures such as a triangular pyramid, a pyramid, and a semicircle may be formed on a surface of the pixel definition layer 115. For example, the pixel definition layer 115 shown in FIG. 3A forms an opening of a M-shaped structure provided with a sloped side wall. Optionally, the pixel definition region 115 may be disposed on the planarization layer 114. The pixel definition layer 115 may be formed by using a plurality of technologies such as ink jet printing, silk-screen printing, lamination, and spin coating. The pixel definition layer 115 may be made of an organic insulating material or an inorganic insulating material, such as acrylic resin, silicon oxide, silicon nitride, or benzocyclobutene.

Figure 3B:
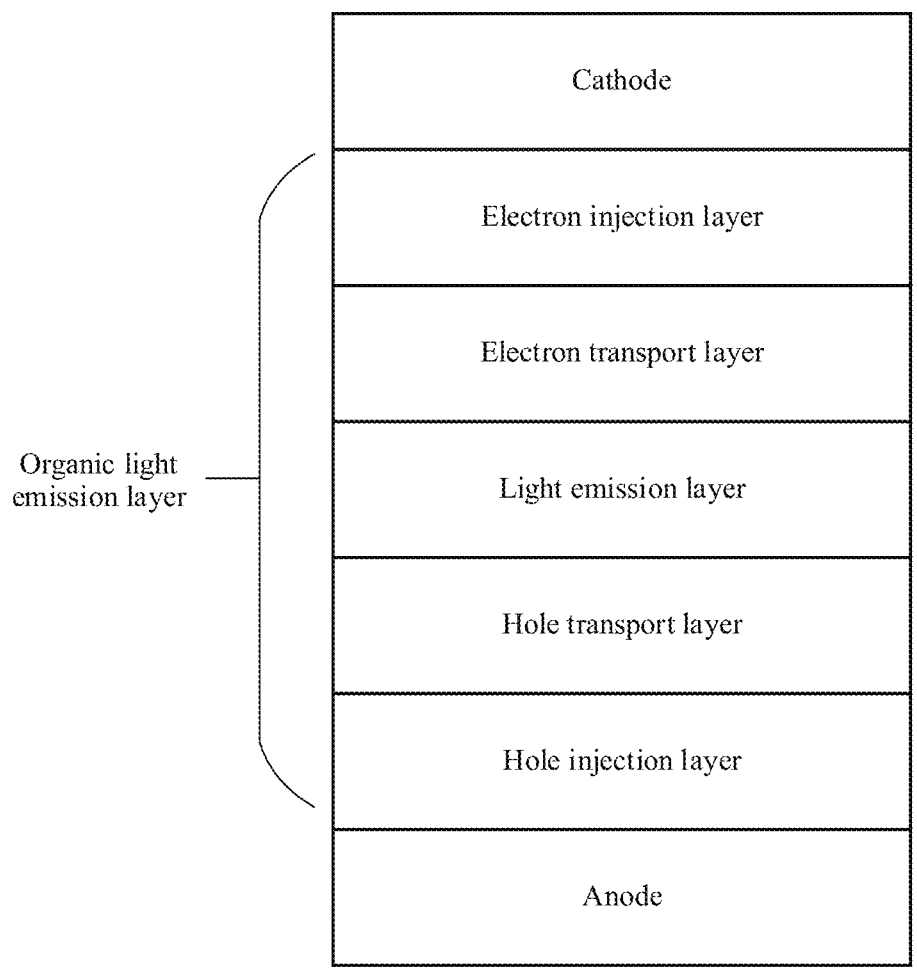
FIG. 3B shows an OLED structure according to an embodiment of this application.

A subpixel is formed at the opening of the pixel definition layer 115 and includes a first electrode, an organic light emission layer, and a second electrode. For example, the subpixel 240 shown in FIG. 3A includes a first electrode 211, an organic light emission layer 212, and a second electrode 213. The first electrode 211 may be an anode electrode, and the second electrode 213 may be a cathode electrode. The first electrode 211 is in contact with the drain electrode 203 of the driver transistor T2 through a contact hole formed by removing a part of the planarization layer 114, is exposed through the opening, and is in contact with the organic light emission layer 212. The first electrode 211 may be made of metal, a metal alloy, conductive metal oxide, a transparent conductive material, or the like. The organic light emission layer 212 may be disposed on the first electrode 211, and the organic light emission layer 212 may be a small-molecule organic light emission layer or a high-molecular organic light emission layer. The high-molecular organic light emission layer is of a structure including only one layer, and the small-molecule organic light emission layer is of a multi-layer structure. As shown in FIG. 3B, the organic light emission layer of a small-molecule structure may include an electron injection (Electron Injection) layer, an electron transport (Electron Transport) layer, a light emission (Emission) layer, a hole transport (Hole Transport) layer, and a hole injection (Hole Injection) layer. Specifically, electrons are injected from a cathode to the electron injection layer, and the electrons enter the electron transport layer after passing through the electron injection layer. Holes are injected from an anode to the hole injection layer, and the holes reach the hole transport layer after passing through the hole injection layer. After reaching the light emission layer, the electrons and the holes form electron hole pairs and then emit light. A type of the organic light emission layer is not limited in this embodiment of this application.

The second electrode 213 is disposed on the organic light emission layer 212, and may be made of metal, a metal alloy, conductive metal oxide, a transparent conductive material, or the like. The first electrode 211 and the second electrode 213 may be made of different materials in different cases. For example, when top emission is performed, that is, when a subpixel emits light in a direction of the second electrode 213, the second electrode 213 may be made of a transparent conductive material (such as indium zinc oxide IZO or indium tin oxide ITO). The first electrode 211 may be made of an opaque conductive material (such as silver Ag or ITO/Ag/ITO). In this way, light generated from the organic light emission layer 212 is to be emitted through the second electrode 213. An advantage of the top emission lies in that: The light is not blocked by the driver circuit.

The TFE thin film package layer 230 may be disposed on the light-emitting frontplane and cover the AMOLED core layer 250. A TFE thin film package technology is a technology in which an inorganic layer and an organic layer are stacked on a light-emitting frontplane, and can prevent entry of oxygen gas and moisture. The TFE thin film package layer 230 is applicable to a foldable and bendable AMOLED display. The TFE thin film package layer 230 may include one organic package layer and at least one inorganic package layer. The inorganic package layer may be used to isolate oxygen gas and moisture, but the inorganic package layer has non-uniform properties. In this case, the organic package layer may be disposed on the inorganic package layer to stabilize the inorganic package layer. The TFE thin film package layer may be fabricated by using a low-temperature atomic layer deposition (ALD) technology or an inductively coupled plasma enhanced chemical vapor deposition (ICP-CVD) technology.

For example, the TFE thin film package layer 230 in FIG. 3A includes a first inorganic package layer 116, an organic package layer 117, and a second inorganic package layer 118. The first inorganic package layer 116 covers the light-emitting frontplane 252 and is made of an inorganic material (such as silicon oxide $SiO_2$). The organic package layer 117 is disposed above the first inorganic package layer 116 and may be made of a material such as polyethylene terephthalate (PET) or polyoxymethylene (Polyoxymethylene). The second inorganic package layer 118 covers the organic package layer 117. The second inorganic package layer 118 may be made of a material such as silicon oxide ($SiO_2$) or silicon nitride ($SiN_x$). It should be noted that the TFE thin film package layer described in this embodiment of this application is merely used as an example, and the TFE thin film package layer may alternatively be formed by stacking 11 inorganic package layers and one organic package layer. With the development of technologies, the TFE thin film package layer may alternatively include a layer of material. A structure of the TFE thin film package layer is not limited in this embodiment of this application.

Further, to prevent entry of oxygen gas and water vapor from a side face of the display region 102, a dam (dam) 221 may be disposed on the insulation interlayer 113. A material of the dam 211 may be the same as that of the planarization layer 114. Alternatively, the material of the dam 211 may be the same as that of the pixel definition layer 115. As shown in FIG. 3A, the first inorganic package layer 116 and the second inorganic package layer 118 are connected near the dam 221, and cover the dam 221. Therefore, during fabrication of the organic package layer 117, the dam 221 can prevent an organic material of the organic package layer from flowing out of the substrate 110. In addition, the dam 221 can be used to increase a penetration distance between a display edge and the organic light emission layer or a metal electrode layer, thereby ensuring sealing performance. There may be one or more dams 221. In the prior art, because a TFE thin film package layer has relatively poor performance of packaging a side face of an AMOLED display, a plurality of dam structures are usually required to prevent entry of oxygen gas and water vapor from the side face of the display, and subpixels cannot be disposed at positions of the dam structures. As a result, the AMOLED display includes a non-display region with a specific width.

In a micro LED display technology, a conventional inorganic LED structure is designed to be a micro thin-film array structure, and a size of a single micro LED component is only approximately 1-10 μm. After the micro LED component is fabricated, the micro LED component is connected to a TFT driver circuit, and the TFT driver circuit controls the single micro LED component to emit light. Compared with an AMOLED, a micro LED has features of high brightness, an ultra-high resolution, and high light emission efficiency. More importantly, the micro LED component is not affected by water vapor and oxygen gas. However, to implement mass production of micro LED displays, several problems still need to be resolved, for example, how to reduce a size of an existing millimeter-level LED component to only 1% of the original size, and how to transfer a huge quantity of fabricated micro LED components to a TFT driver backplane to enable each micro LED component to be connected to one TFT driver circuit. Especially, for the latter problem, no suitable method is available in the prior art. Using a full high definition (Full High Definition, FHD) mobile phone display as an example, if a resolution of the display is 2160×1080, each pixel includes three subpixels. When the display is fabricated by using the micro LED display technology, approximately seven million (2160×1080×3) micro LED components need to be fabricated, and then the fabricated approximately seven million micro LED components need to be transferred to a TFT driver backplane. Each micro LED component needs to be accurately connected to one TFT driver circuit. This imposes a huge challenge to a process. In addition, before the micro LED components are transferred, whether the seven million micro LED components can emit light needs to be detected. A micro LED component that cannot emit light normally needs to be repaired or replaced after the micro LED components are transferred. This causes huge costs of fabricating the micro LED display. Therefore, in the smartphone field, mass production of micro LED displays still cannot be implemented.

Figure 18:
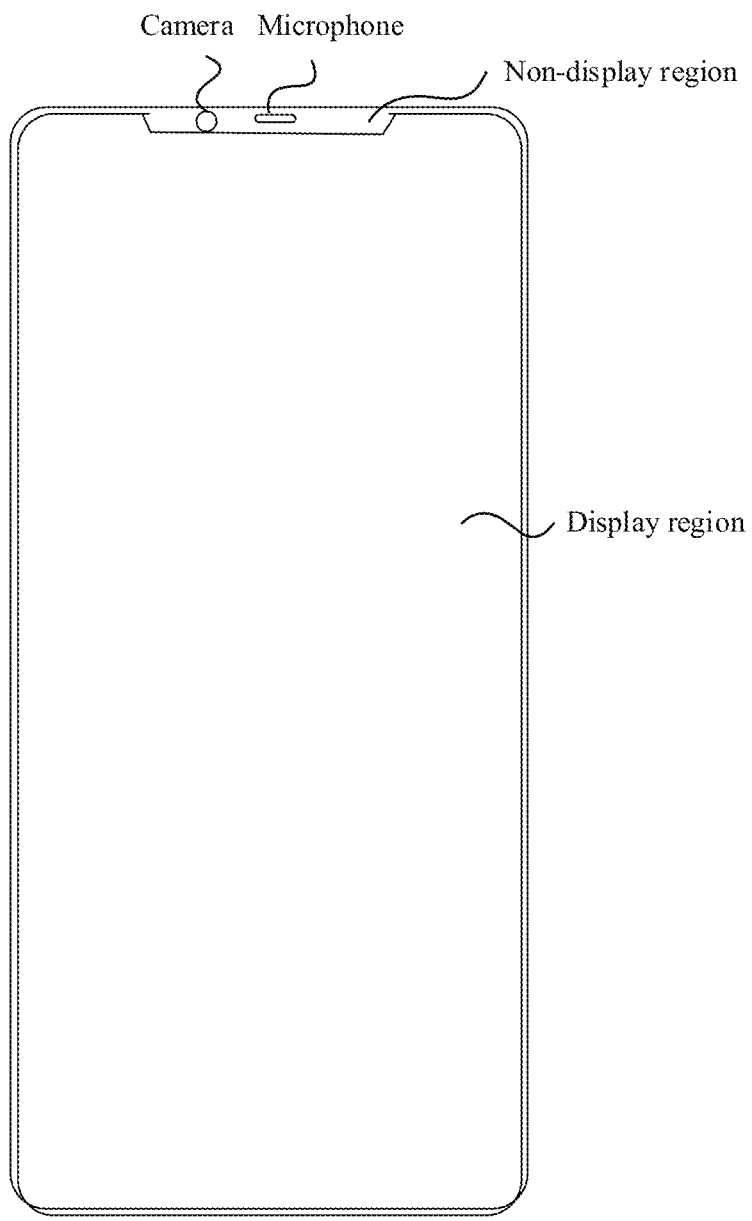
FIG. 18 is a schematic diagram of a front face of a mobile phone according to an embodiment of this application.

A display is described in an embodiment of this application. The display is divided into a display region and a bezel region. An AMOLED display technology is used for the display region, and a limited quantity of micro LED components and driver circuits are placed in the bezel region. According to this embodiment of this application, content may also be displayed in the bezel region, thereby greatly narrowing down a non-display package region. In addition, a difficulty in transferring a huge quantity of micro LEDs is overcome under a current technical condition, and a sealing condition of an OLED is satisfied. FIG. 18 shows a mobile phone using the display described in this embodiment of this application. Compared with the front face of the mobile phone shown in FIG. 1A, a ratio of an area of a non-display region to an area of a front face of the mobile phone is significantly reduced.

An embodiment of this application relates to a micro LED component, including a P-N diode. It can be understood that another micro semiconductor apparatus may also be disposed in a same manner as the micro LED component.

In a micro light-emitting diode (micro Light Emitting Diode, micro LED) display technology, an LED structure is designed to be a micro thin-film array structure, and a size of a single micro LED component is only approximately 1-10 μm. A huge quantity of micro LED components are transferred to a circuit substrate in an addressing manner after the micro LED components are fabricated, to form a display including LEDs with an ultra-small spacing. Such a display has ultra-high pixels and an ultra-high resolution. Theoretically, the micro LED display technology can be used to fabricate screens of various sizes. However, because of a technology bottleneck of transferring a huge quantity of micro LED components, the micro LED technology still cannot implement mass production of micro LED displays currently.

In the following embodiment, by utilizing a characteristic that a micro LED component is not affected by water vapor and oxygen gas, the micro LED component is disposed in a bezel region of an AMOLED display to replace a dam structure, to prevent external water vapor and oxygen gas from entering a light-emitting frontplane from a side face of the AMOLED display. Because the micro LED component may be configured to display an image, by using this display fabrication method, a region that is of the display and in which no picture can be displayed can be effectively reduced. In addition, a relatively small quantity of micro LED components are required to fully cover the bezel region, and a technical problem of transferring a large quantity of micro LED components is not involved.

The micro LED technology includes various full-color display methods such as an RGB three-color method, a UV/blue light method, and an optical lens composition method. The RGB three-color method is based on an RGB three-primary color principle, and is used to compose various colors by using a micro LED component that emits red light, a micro LED component that emits blue light, and a micro LED component that emits green light. This method is mainly used for an LED screen currently. The UV/blue light method includes: placing a light-emitting medium that emits red or green light on a micro-LED component that emits blue light, to make the micro-LED component that emits blue light emit red light or green light. For example, when the UV/blue light method is used, three micro LED components that emit blue light may be placed in one pixel, a light-emitting medium that emits green light is placed above one of the micro LED components, and a light-emitting medium that emits red light is placed above another micro LED component. In this way, the pixel can emit white light or light of any other color. Light-emitting media may usually be classified into phosphor powder and quantum dots. The phosphor powder may be a material such as sulfide, aluminate, oxide, silicate, or nitride, and emits light with a specific wavelength under excitation of a micro LED component that emits blue light. A size of phosphor powder particles may range from 100 nm to 1 μm. Quantum dots are a type of nanoparticles, and can emit light of different colors after being excited by light.

For ease of description, the RGB three-color display method is used in the following embodiments. It can be understood that the embodiments of this application is also applicable to another display method.

In this embodiment, a physical pixel in a bezel region needs to be disposed based on a bezel width, a pixel density, and a size of a micro LED component. For example, in the prior art, a bezel width is usually 1 mm. If a pixel density of a display is 400 PPI (there are 400 pixels in an area whose diagonal is one inch in length), a width of each pixel is approximately 63.5 μm. For example, 15 pixels (15×63.5 μm=952.5 μm) need to be disposed in a width range C-D of the bezel region 101 shown in FIG. 1C. In the prior art, a size of a micro LED component may be 15-30 μm. Therefore, two or three micro LED components may be placed in each pixel.

In some embodiments, a conventional RGB arrangement manner may be used. To be specific, three micro LED components, namely a micro LED component that emits red light, a micro LED component that emits blue light, and a micro LED component that emits green light, are placed in each micro LED pixel. One pixel may display white light or light of any color.

In some other embodiments, two micro LED components may be placed in each micro LED pixel in a Pentile arrangement, and the two micro LED components may be a micro LED component that emits red light and a micro LED component that emits green light, or may be a micro LED component that emits blue light and a micro LED component that emits green light. When one virtual pixel emits light, at least three colors are required: red, green, and blue. Therefore, when displaying one virtual pixel, each micro LED pixel needs to use a micro LED component that emits red light or a micro LED component that emits blue light that is included in an adjacent micro LED pixel.

The following details the Pentile arrangement by using FIG. 8A as an example. As shown in FIG. 8A, FIG. 8A-1 shows a Pentile arrangement, and FIG. 8A-2 shows an RGB arrangement. Each pixel in the Pentile arrangement includes two subpixels, and each pixel in the RGB arrangement includes three subpixels. For example, a pixel 810 includes a red subpixel 801 and a green subpixel 802, a pixel 820 includes a blue light subpixel 803 and a green light subpixel 804, and a pixel 830 includes a red subpixel 805, a green light subpixel 806, and a blue light subpixel 807. During light emission, if the pixel 810 is expected to emit white light, the blue light subpixel 803 in the pixel 820 needs to be used. In this case, the red light subpixel 801 and the green light subpixel 802 in the pixel 810 and the blue light subpixel 803 in the pixel 820 jointly emit light to display one white virtual pixel. In this way, a quantity of subpixels is reduced when a same resolution is implemented.

It should be noted that in this embodiment of this application, a pixel may include different quantities of subpixels, and subpixels may be arranged by using different solutions, for example, red-green-blue-yellow, red-green-blue-yellow-cyan, and red-green-blue-white. The subpixel arrangement manners described in this embodiment of this application are merely used as examples.

Figure 5:
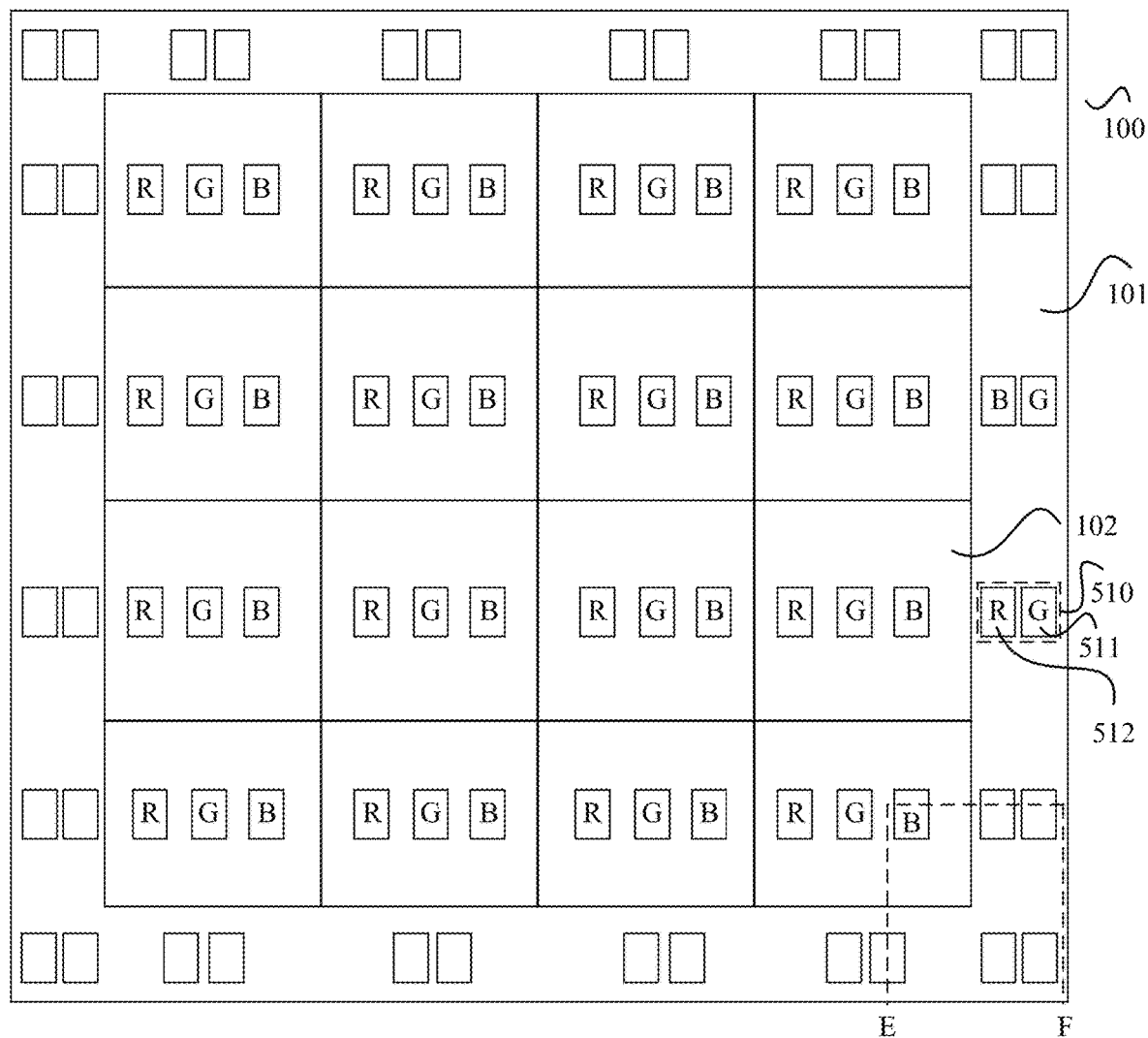
FIG. 5 is a plan view of an AMOLED display according to an embodiment of this application.

Because it is difficult to further reduce a size of a micro LED component in the prior art, for example, two micro LED components are placed in each micro LED pixel in an embodiment of this application. FIG. 5 is a plan view of an AMOLED display according to an embodiment of this application. Similar to the AMOLED display 200 shown in FIG. 1, the AMOLED display shown in FIG. 5 also includes a display region 102 and a bezel region 101. A difference between FIG. 1 and FIG. 5 lies in: The bezel region 101 shown in FIG. 5 includes a plurality of pixels, each pixel includes two subpixels, each subpixel is a micro LED component, and the micro LED component may emit one of red light, blue light, or green light. For example, a pixel 510 may include subpixels 511 and 512. In some embodiments, the subpixel 511 may emit red light, and the subpixel 512 may emit green light. In some other embodiments, the subpixel 511 may emit blue light, and the subpixel 512 may emit green light. Because the micro LED pixels are disposed in the bezel region 101 shown in FIG. 5, content of a picture can be displayed in the bezel region 101, but a concept of a bezel in the prior art is still used. Therefore, the region 101 of the new AMOLED screen shown in FIG. 5 is still referred to as a bezel region.

Figure 6:
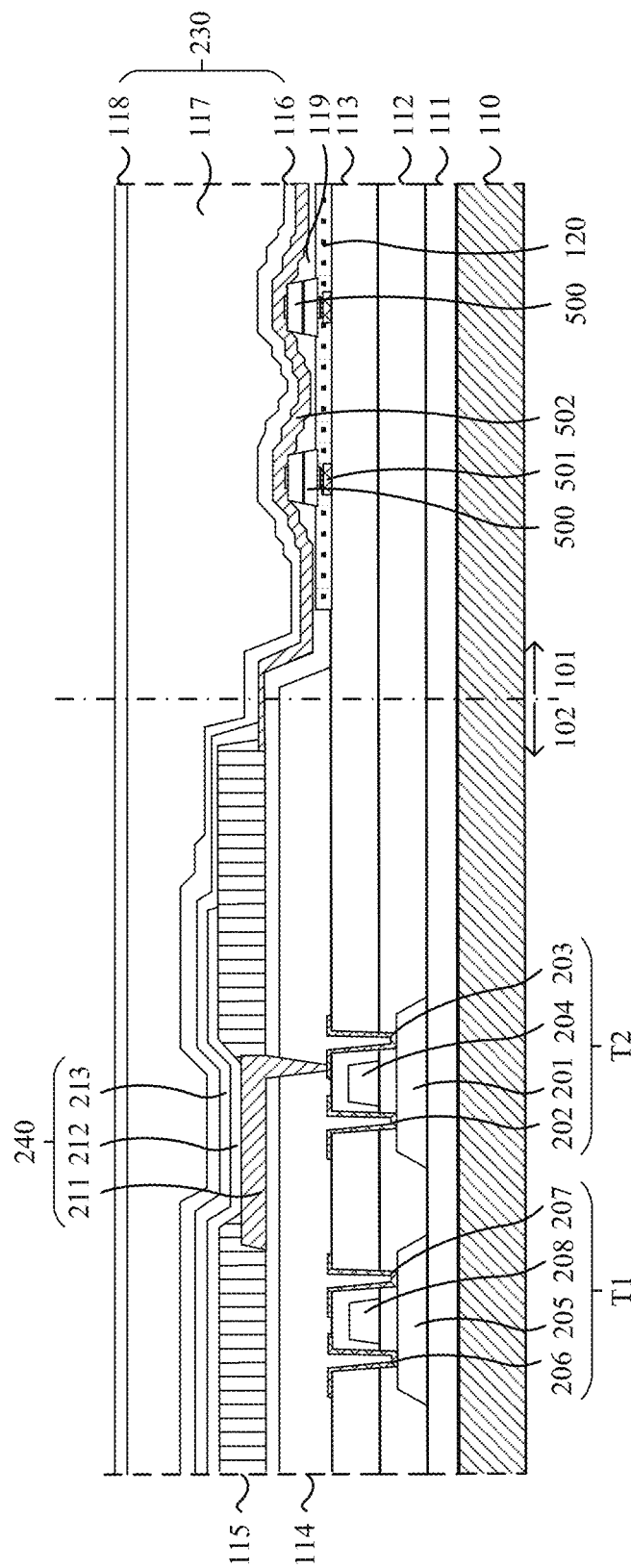
FIG. 6 is a cross-sectional view of the AMOLED display shown in FIG. 5.

FIG. 6 is a cross-sectional view obtained by cutting along a line E-F in FIG. 5, in which a micro LED component uses a passive matrix (Passive Matrix) drive manner. Similar to the display shown in FIG. 3A, the display region 102 of the display shown in FIG. 6 includes a driver circuit backplane, a light-emitting frontplane, and a TFE package layer. Compared with the structure of the display shown in FIG. 3A, the micro LED component is disposed in the bezel region 101 of the display shown in FIG. 6, and the micro LED component has a function of a dam structure and can display a graphical user interface.

A micro LED component 500 shown in FIG. 6 may be a vertical type micro LED structure shown in FIG. 7. It should be noted that the structure of the micro LED component shown in FIG. 6 is merely used as an example. Based on different drive manners, the micro LED component may alternatively be a flip-type micro LED component. Details are described below.

FIG. 7 shows the vertical type micro LED structure. As shown in FIG. 7, the micro LED component 500 may include a top electrode 511, a bottom electrode 512, and a p-n diode. The p-n diode may include an n-doped layer (n-doped layer) 523, a p-doped layer (p-doped layer) 521, and a quantum well layer (quantum well layers) 522. There may be one or more quantum well layers. As shown in FIG. 7, the p-doped layer 521 is located above the n-doped layer 523. In some other embodiments, the n-doped layer 523 may be located above the p-doped layer 521. The top electrode 511 and the bottom electrode 512 may be made of various conductive materials including metal, conductive oxide, and conductive polymer. The top electrode 511 may be in contact with a fourth electrode 502, and the bottom electrode 512 may be bonded to a third electrode 501 by using a bonding layer 513. The bonding layer 513 may be made of a solder material such as tin, indium, or an alloy thereof.

Figure 10:
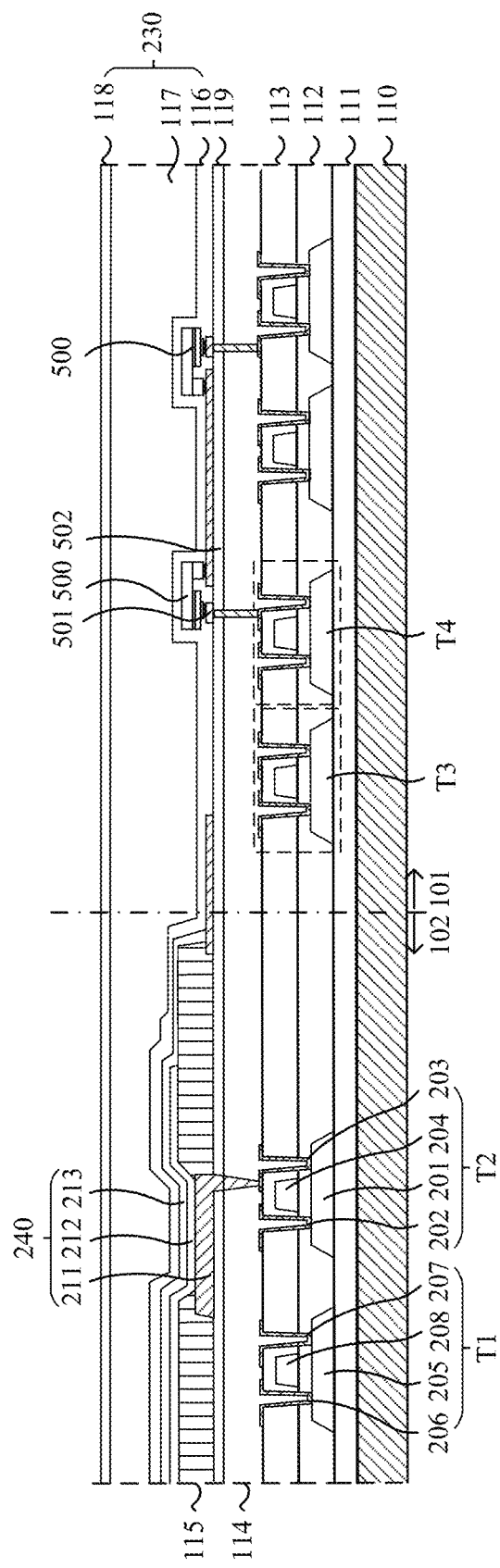
FIG. 10 is a cross-sectional view of another AMOLED display according to an embodiment of this application.
Figure 11:
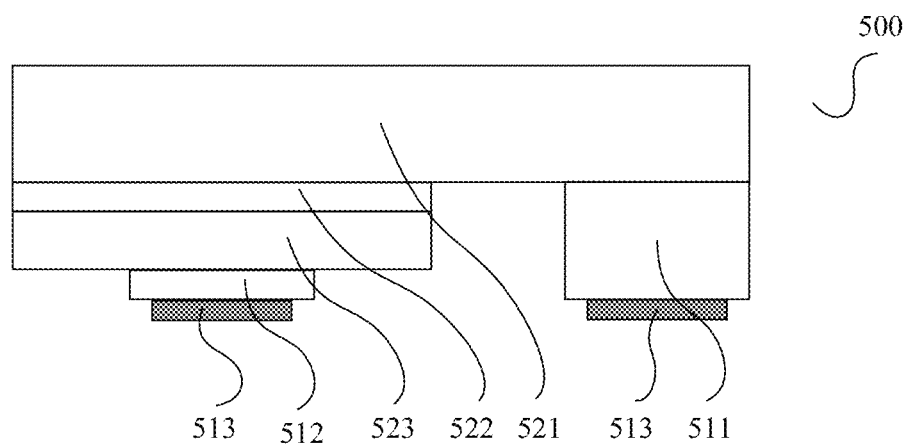
FIG. 11 is a schematic diagram of another micro LED component according to an embodiment of this application.

FIG. 11 shows a flip-type micro LED component. Similar to the micro LED component shown in FIG. 7, the micro LED component shown in FIG. 11 includes a top electrode 511, a bottom electrode 512, and a p-n diode. The p-n diode may include an n-doped layer (n-doped layer) 523, a p-doped layer (p-doped layer) 521, and a quantum well layer (quantum well layers) 522. Different from the micro LED component shown in FIG. 7, both the top electrode 511 and the bottom electrode 512 of the micro LED component 500 shown in FIG. 11 are located at the bottom of the micro LED component 500 and are connected to a bonding layer 513. The n-doped layer (n-doped layer) 523 is in contact with one electrode, for example, a third electrode 501 shown in FIG. 10, through the bottom electrode 512 and the bonding layer 513. The p-doped layer (p-doped layer) 521 is in contact with another electrode, for example, a fourth electrode 502 shown in FIG. 10, through the top electrode 511 and the bonding layer 513. An advantage of the flip-type micro LED component lies in that: The third electrode and the fourth electrode may be disposed on a same plane. In this way, the third electrode and the fourth electrode can be simultaneously fabricated, without a need to be separately fabricated. This reduces a difficulty of a fabrication process.

Figure 16:
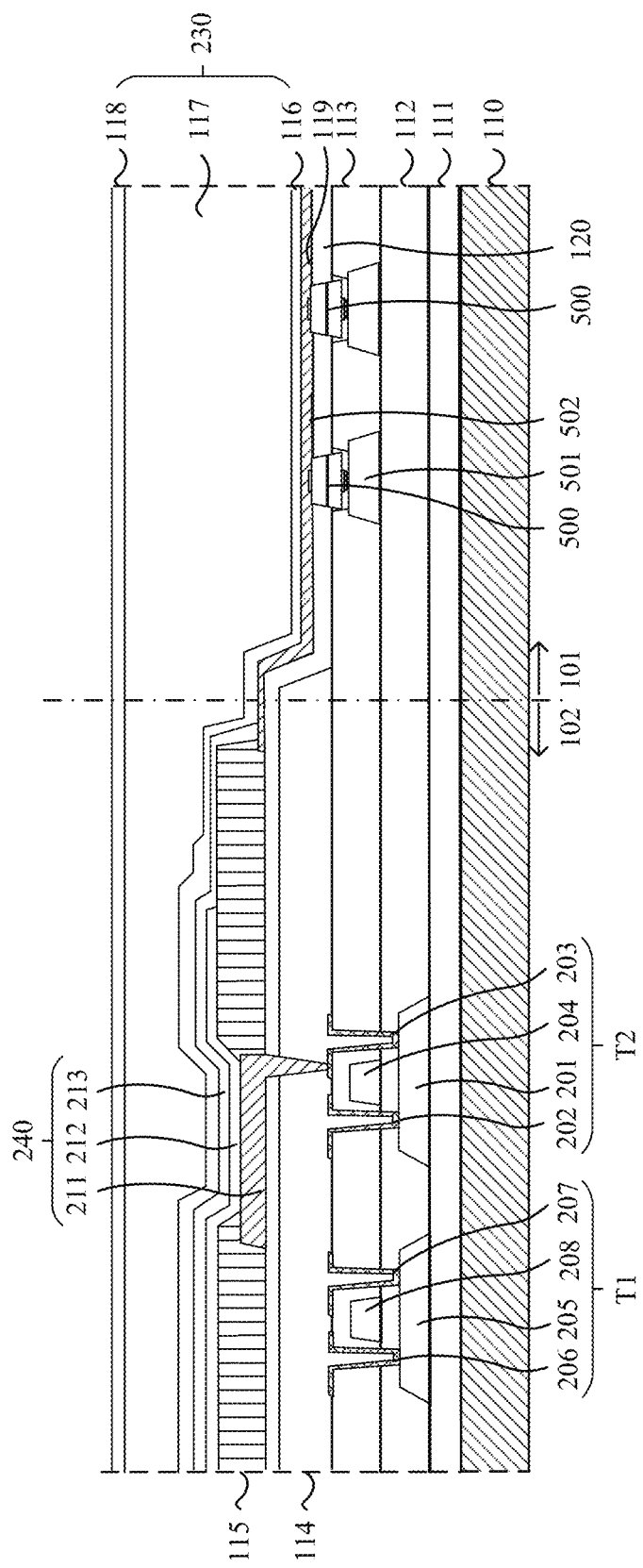
FIG. 16 is a cross-sectional view of another AMOLED display according to an embodiment of this application.

The third electrode and the fourth electrode connected to the micro LED component may be disposed at different positions in a bezel region of an AMOLED display depending on a process and a requirement. To make use of an existing fabrication process of an AMOLED display to a greatest extent and reduce a difficulty in fabricating a display in an embodiment of this application, a third electrode 501 shown in FIG. 6 may be disposed on an insulation interlayer 113. In some other embodiments, as shown in FIG. 16, a third electrode 501 may be disposed on a gate insulation layer 112, is exposed after passing through a hole in an insulation interlayer 113, and is in contact with a micro LED component 500. The micro LED component 500 may be fastened to the third electrode 501 by using a bonding layer 513. A passivation layer 119 may cover the third electrode 501 and the micro LED component 500, and insulate a bottom electrode connected to the micro LED component 500 from a top electrode connected to the micro LED component 500. In addition, the passivation layer 119 may further insulate a side wall of the micro LED component 500 from the top electrode or the bottom electrode. In some embodiments, the passivation layer 119 may be fabricated after the micro LED component 500 is installed. Optionally, the passivation layer 119 may first be made to completely cover the micro LED component 500 and the third electrode 501. Then, a through hole is provided in the passivation layer 119 to expose the micro LED component 500. The following details a specific fabrication manner thereof.

In some embodiments, the micro LED component 500 may protrude above the passivation layer, and a passivation layer residue of the top electrode of the micro LED component 500 is removed through etching; and then a fourth electrode 502 is fabricated and is connected to the micro LED component 500.

A fourth electrode 502 shown in FIG. 6 may be disposed above a passivation layer 119, and is in contact with the exposed micro LED component 500 through a notch formed by the passivation layer 119. The third electrode 501 and the fourth electrode 502 may be made of different materials in different cases. For example, the third electrode 501 may be made of a transparent conductive material (such as indium zinc oxide IZO or indium tin oxide ITO). The fourth electrode 502 may be made of an opaque conductive material (such as silver Ag or ITO/Ag/ITO). In some embodiments, the third electrode 501 may be used as a cathode, the fourth electrode 502 may be used as an anode, both the third electrode 501 and the fourth electrode 502 are connected to a driver IC, and the driver IC is a micro-LED driver IC. In some embodiments, as shown in FIG. 6, an LS light shielding layer (light-shield layer) 120 may be disposed on the third electrode 501. The LS light shielding layer 120 has an insulation function, and can absorb light emitted from the bottom of the micro LED component 500 or light leaked from a side part of the micro LED component 500, thereby reducing light crosstalk between LED pixels.

Figure 15:
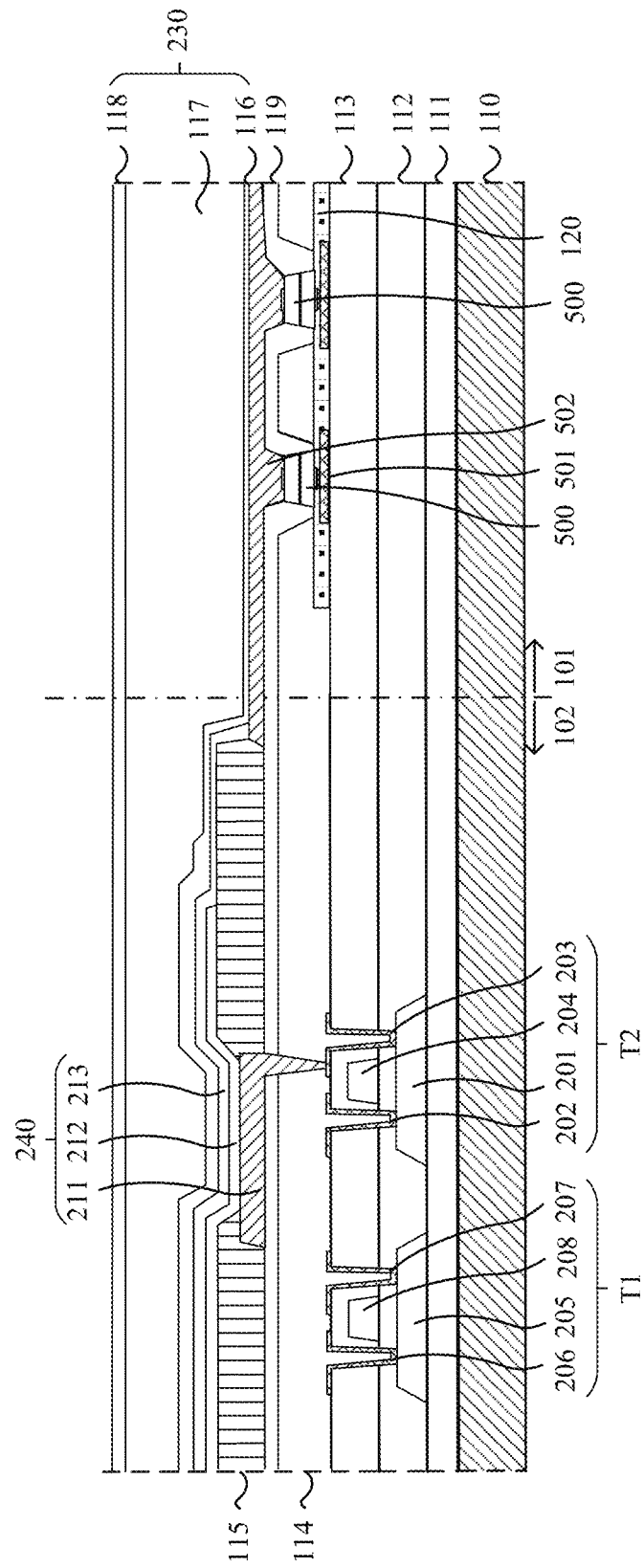
FIG. 15 is a cross-sectional view of another AMOLED display according to an embodiment of this application.

FIG. 15 is a schematic diagram of another embodiment in which a passive matrix drive manner is used.

Similar to the display 200 shown in FIG. 6, a micro LED component is disposed in a bezel region 101 of a display 200 shown in FIG. 15, a third electrode 501 is disposed on an insulation interlayer 113, the micro LED component is disposed on the third electrode 501, and a fourth electrode 502 is disposed on a passivation layer 119. A difference between FIG. 6 and FIG. 15 lies in that a planarization layer 114 of the display 200 shown in FIG. 15 extends to the bezel region to cover the third electrode 501. The third electrode 501 is exposed by removing a partial region of the planarization layer 114, and then is connected to the micro LED component 500.

Figure 8B:
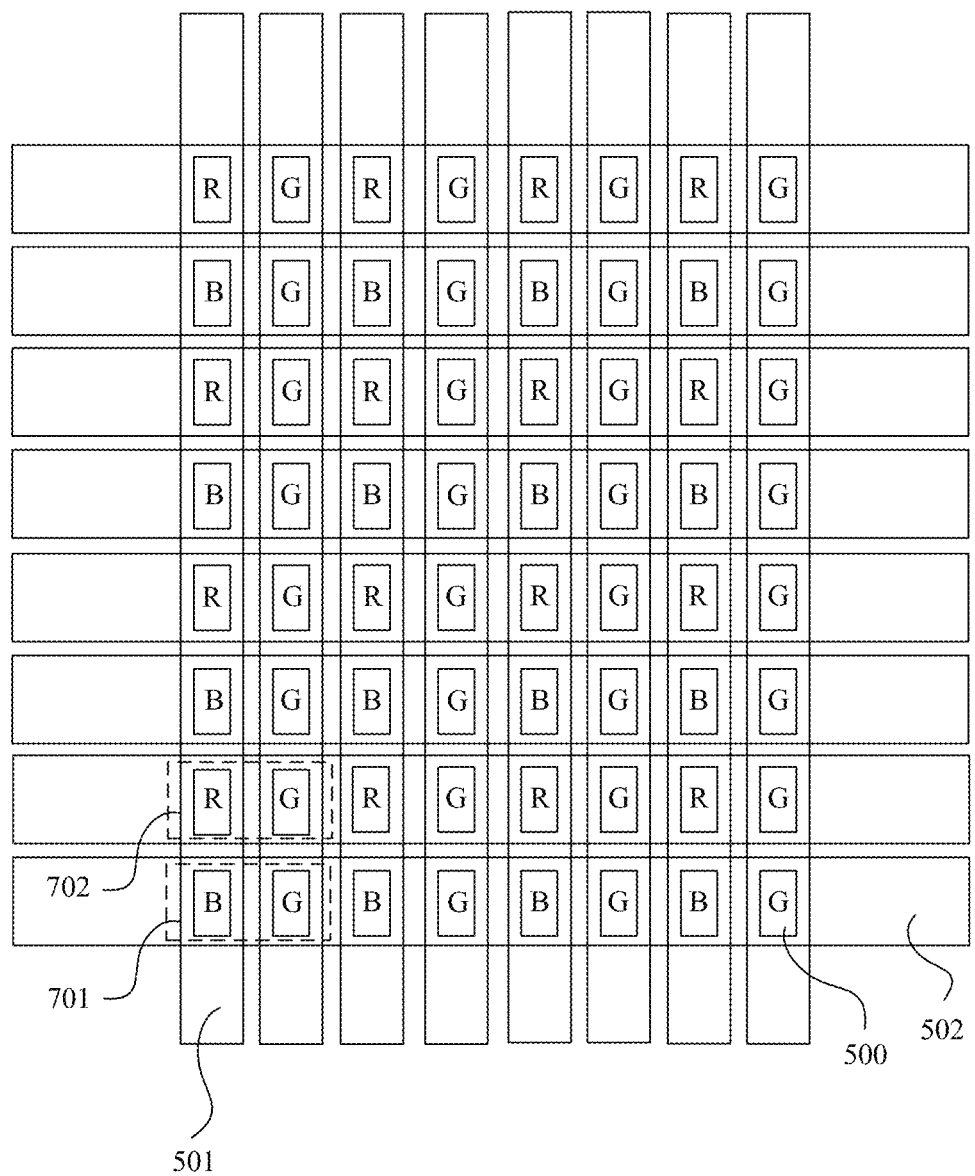
FIG. 8B is a schematic diagram of a subpixel arrangement manner according to an embodiment of this application.

FIG. 8B is a schematic diagram of an arrangement sequence of micro LED components in a bezel region of a display according to an embodiment of this application.

As shown in FIG. 8B, the micro LED component uses a passive matrix drive manner, and a plurality of third electrodes 501 and a plurality of fourth electrodes 502 are all connected to a micro-LED driver IC (not shown in the figure). The third electrode 501 may be understood as an electrode layer, and one electrode of each of the plurality of micro LED components is in contact with the electrode layer. Similarly, the fourth electrode 502 may also be understood as an electrode layer.

Figure 9:
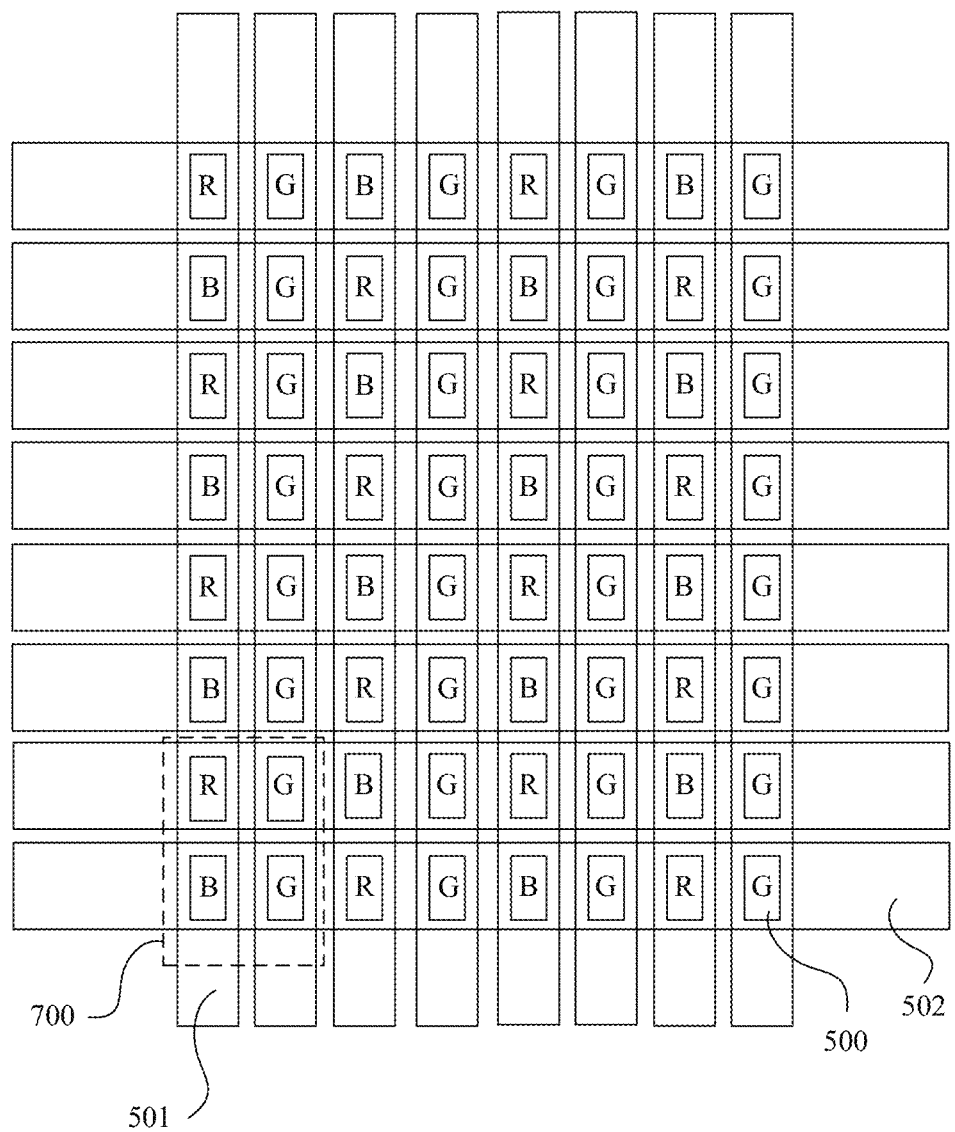
FIG. 9 is a schematic diagram of another subpixel arrangement manner according to an embodiment of this application.

As shown in FIG. 8B, the micro LED components in the bezel region are arranged in a Pentile form. For example, a pixel 702 includes one red subpixel and one green subpixel, and a pixel 701 includes one blue subpixel and one green subpixel. Subpixels located on the fourth electrodes 502 are alternately arranged from left to right in two sequences: blue-green-blue-green and red-green-red-green. It should be noted that the manner shown in FIG. 8B in which the subpixels are alternately arranged in the two sequences, namely red-green and blue-green, is merely used as an example. In some other embodiments, as shown in FIG. 9, subpixels located on fourth electrodes 502 are arranged from left to right in a sequence: red-green-blue-green. This arrangement sequence can prevent red pixels or blue pixels from forming a vertical line, thereby improving display quality. In some other embodiments, micro LED components in a bezel region may be arranged in a Bayer form.

FIG. 10 shows another cross-sectional view obtained by cutting along a line C-D in FIG. 5, in which a micro LED component is of the flip-type structure shown in FIG. 11 and drives light emission in an active matrix (Active Matrix) drive manner.

As shown in FIG. 10, in addition to the micro LED component, a TFT driver circuit used to control the micro LED component is further disposed in a bezel region 101. For example, the TFT driver circuit may include a transistor T3 and a transistor T4 in FIG. 10. For example, in the embodiment shown in FIG. 10, a 2T1C pixel driver circuit may be used to drive the micro LED component to emit light. Optionally, a planarization layer 114 extends to the bezel region 101. In this way, the planarization layer 114 can provide a flat plane for the micro LED component, and an electrode fabrication process is simpler.

The micro LED component shown in FIG. 10 is the flip-type micro LED component shown in FIG. 11, and is connected to two electrodes. For example, the micro LED component 500 shown in FIG. 10 is connected to a third electrode 501 and a fourth electrode 502. The bottom electrode 512 of the micro LED component shown in FIG. 11 is in contact with the third electrode 501, and the top electrode 511 of the micro LED component is in contact with the fourth electrode 502. Optionally, all micro LED components may be connected to a same fourth electrode 502. The fourth electrode 502 may be an anode. Optionally, both the third electrode 501 and the fourth electrode 502 are disposed on a passivation layer 119. An advantage of using the flip-type micro LED component is: During fabrication of the third electrode and the fourth electrode, the third electrode and the fourth electrode can be fabricated at a same time as a first electrode, thereby reducing a difficulty in display fabrication.

The third electrode 501 and the fourth electrode 502 may be constructed by using ITO/Ag/ITO, and fabrication processes of the third electrode 501 and the fourth electrode 502 are the same as a fabrication process of a first electrode 211. As shown in FIG. 10, the third electrode 501 is in contact with a drain electrode of a driver transistor in the 2T1C driver circuit through a contact hole formed by removing parts of the passivation layer 119 and the planarization layer 114. For example, the third electrode 501 connected to the micro LED component 500 shown in FIG. 10 is in contact with a drain electrode of the transistor T4.

A TFE thin film package structure 230 covers the micro LED component 500. Optionally, the third electrode 501 and the fourth electrode 502 shown in FIG. 10 may be covered with an LS light shielding layer (not shown in the figure). Micro LED components shown in FIG. 10 may be arranged in the RGBG manner shown in FIG. 8B. It can be understood that an arrangement manner of the micro LED components is not limited in this embodiment of this application.

Figure 17:
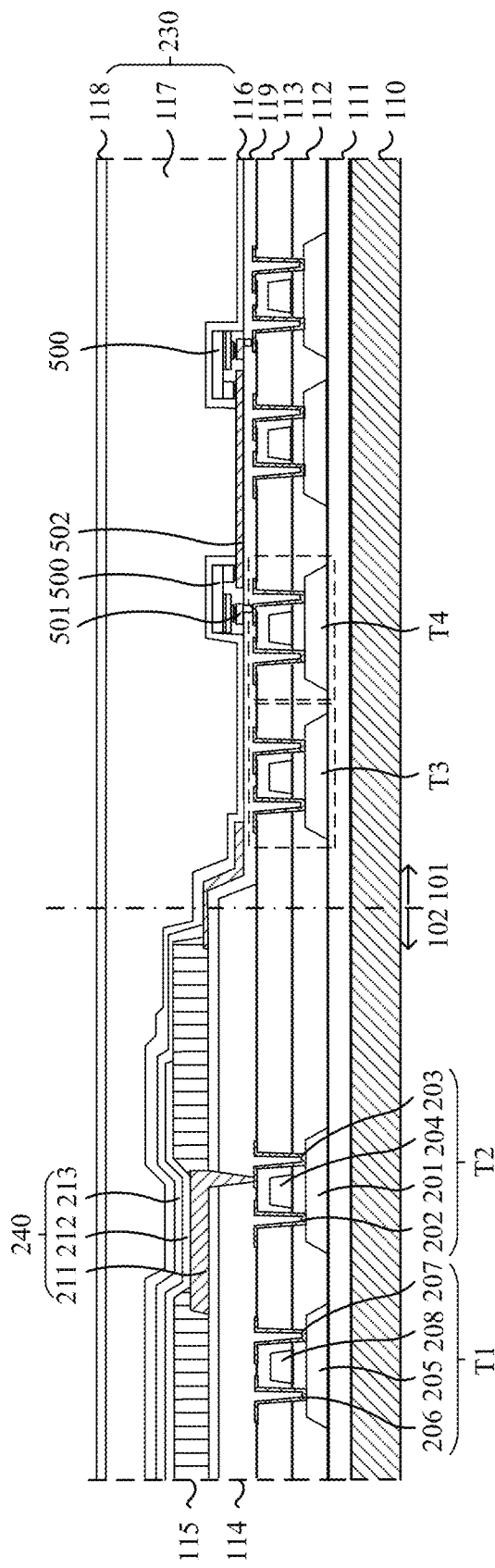
FIG. 17 is a cross-sectional view of another AMOLED display according to an embodiment of this application.

In some other embodiments, as shown in FIG. 17, a planarization layer 114 of a display 200 does not extend to a bezel region 101, and a third electrode 501 is in contact with a transistor T4 through a contact hole formed by removing a part of a passivation layer 119. In this way, an existing fabrication process of a passivation layer does not need to be changed.

Figure 12:
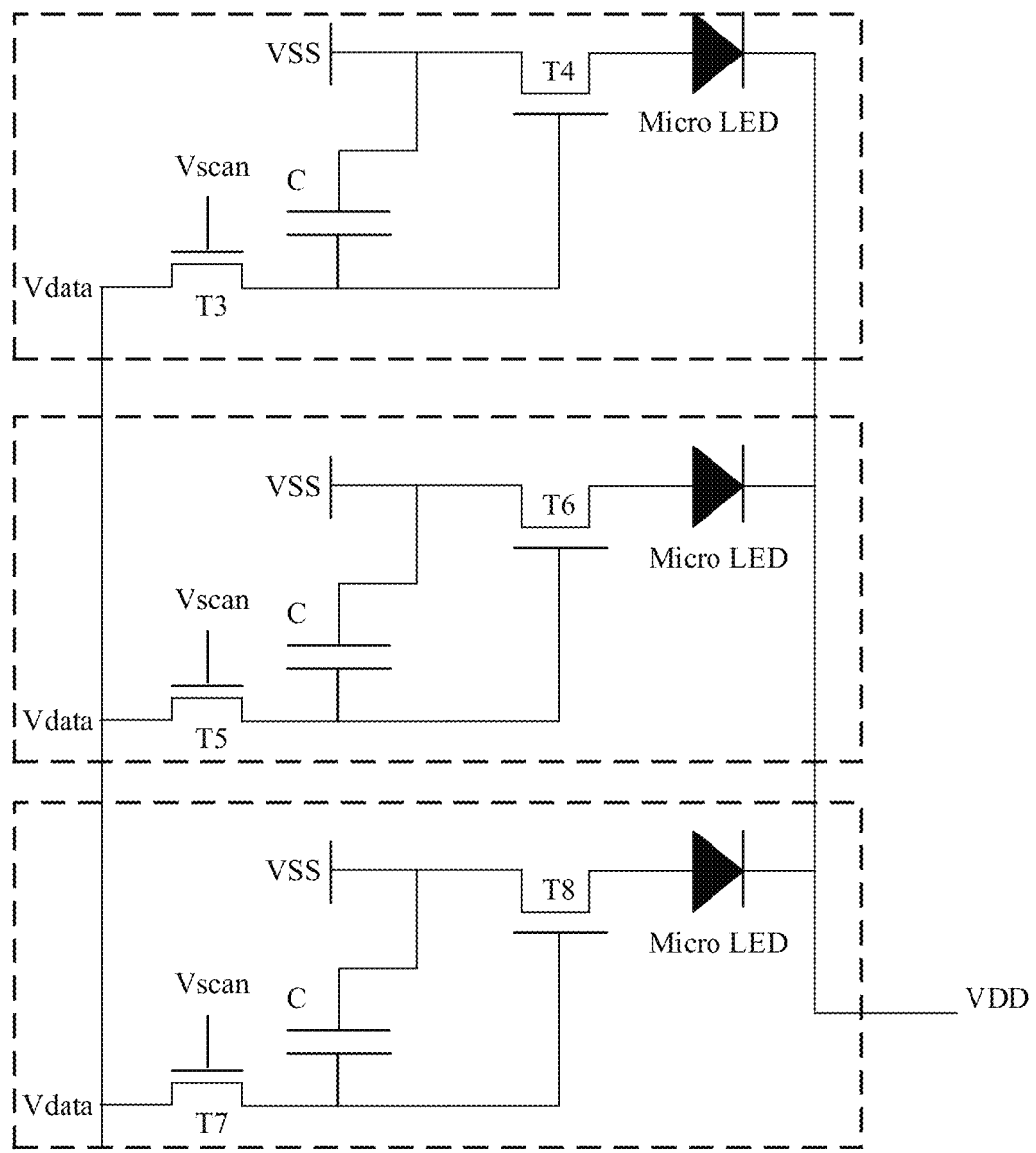
FIG. 12 is a schematic diagram of another pixel driver circuit according to an embodiment of this application.

FIG. 12 shows a connection manner of active driver circuits for micro LED components. FIG. 12 shows three dotted boxes, where each box represents a driver circuit used to drive a micro LED component to emit light. It should be understood that the connection manner of the driver circuits for the three micro LED components shown in FIG. 12 is merely used as an example. This connection manner may be used for connection of driver circuits for all micro LED components.

Similar to the 2T1C driver circuit shown in FIG. 4, each driver circuit includes two transistors and one capacitor. One of the transistors is a switching transistor, and the other transistor is a driver transistor. For example, T3 may be a switching transistor, and T4 may be a driver transistor. T3, T4, and a capacitor C jointly drive a micro LED component to emit light. Different from the 2T1C driver circuit shown in FIG. 4, the micro LED component shown in FIG. 12 is connected to the driver transistor and a positive voltage VDD. For example, all the micro LED components are jointly connected to an electrode that transmits the positive voltage VDD, for example, the fourth electrode 502 shown in FIG. 10. A source electrode of the driver transistor is connected to a negative voltage VSS. Optionally, a light regulation manner may be a pulse width modulation (PWM) manner. An advantage of this circuit connection manner is that the OLED driver circuit can be partially utilized. For example, a scan signal Vscan connected to the switching transistor shown in FIG. 12 may be output by using a gate driver circuit of an AMLOED screen. Optionally, the gate driver circuit may be an integrated gate driver circuit (Gate driver On Array, GOA), and the gate driver circuit is integrated to a drive backplane. In this way, material costs and fabrication process costs can be reduced. A signal Vdata may be output by a micro-LED driver IC. In this way, a circuit for driving the micro LED component to output the scan signal Vscan does not need to be separately disposed.

To reduce a difficulty in fabricating the AMOLED display in this embodiment of this application, the third electrode and the fourth electrode that are connected to the micro LED component in the bezel region may be fabricated by using an existing processing process of an AMOLED display.

In some embodiments, the fourth electrode 502 shown in FIG. 6, and the third electrode and the fourth electrode that are shown in FIG. 10 may all be fabricated by using a processing process of the first electrode 211. The following provides a specific description with reference to FIG. 13.

Figure 13:
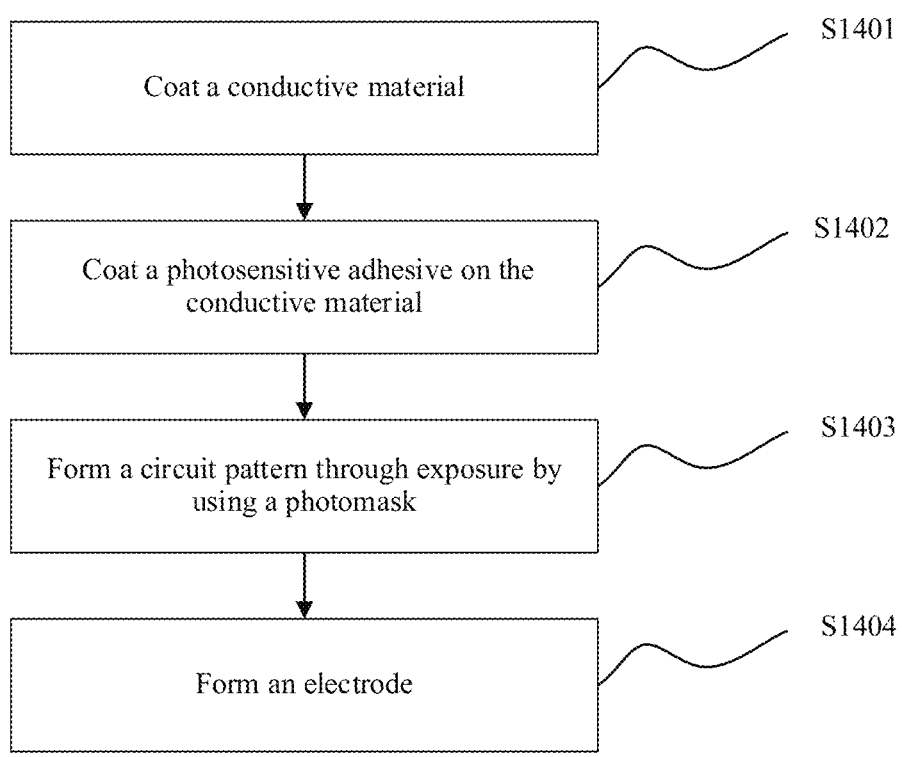
FIG. 13 shows an electrode fabrication method according to an embodiment of this application.

FIG. 13 shows a processing process of a first electrode 211. S1401. Coat a conductive material.

As shown in FIG. 6, when the AMOLED uses a top emission mode, the first electrode 211 may be fabricated by using an ITO/Ag/ITO thin film material. A fabrication method for the ITO/Ag/ITO thin film material includes: successively coating an ITO layer, an Ag layer, and an ITO layer on a passivation layer 119, and then forming the ITO/Ag/ITO thin film material. The ITO layer is a transparent layer, and the Ag layer is an opaque layer. To ensure that the micro LED component emits light upwards, the fourth electrode 502 needs to be made of a transparent material. Therefore, during fabrication of the Ag layer, a photomask may be added above the bezel region 101, and only the ITO layer is retained. In other words, a conductive material coated in the display region 102 is the ITO/Ag/ITO thin film material, and a conductive material coated in the bezel region 101 is an ITO thin film material.

S1402. Coat a photosensitive material on the conductive material.

The photosensitive material may be a photoresist and is dissolved after being irradiated by light S1403. Form a circuit pattern through exposure by using a photomask.

In an existing process, a circuit pattern of the first electrode 221 may be added to the photomask, and the circuit pattern of the first electrode 221 is displayed on the photosensitive material through exposure. A part irradiated by light needs to be removed, and a circuit that needs to be retained is a part that is shielded by the photomask and that is not irradiated by the light. In some embodiments, if the micro LED component uses a passive drive manner, circuit patterns of the first electrode 221 and the fourth electrode 502 that are shown in FIG. 6 may be added to a photomask. After exposure is performed on the circuit patterns, the circuit patterns of the first electrode 211 and the fourth electrode 502 are displayed.

In some other embodiments, if the micro LED component uses an active matrix drive manner, circuit patterns of the first electrode 221, the third electrode 501, and the fourth electrode 502 that are shown in FIG. 10 may be added to a photomask. After exposure is performed on the circuit patterns, the circuit patterns of the first electrode 211, the third electrode 501, and the fourth electrode 502 are displayed.

S1404. Form an electrode.

The conductive material in a circuit pattern region is retained through etching, and then the photosensitive material is removed to obtain the electrode. In some embodiments, the electrode includes the first electrode 221 and the fourth electrode 502 that are shown in FIG. 6.

In some other embodiments, the electrode includes the first electrode 221, the third electrode 501, and the fourth electrode 502 that are shown in FIG. 10.

In some embodiments, the third electrode 501 shown in FIG. 6 may be fabricated by using a processing process of a TFT driver circuit backplane. The following provides a specific description with reference to FIG. 14.

Figure 14:
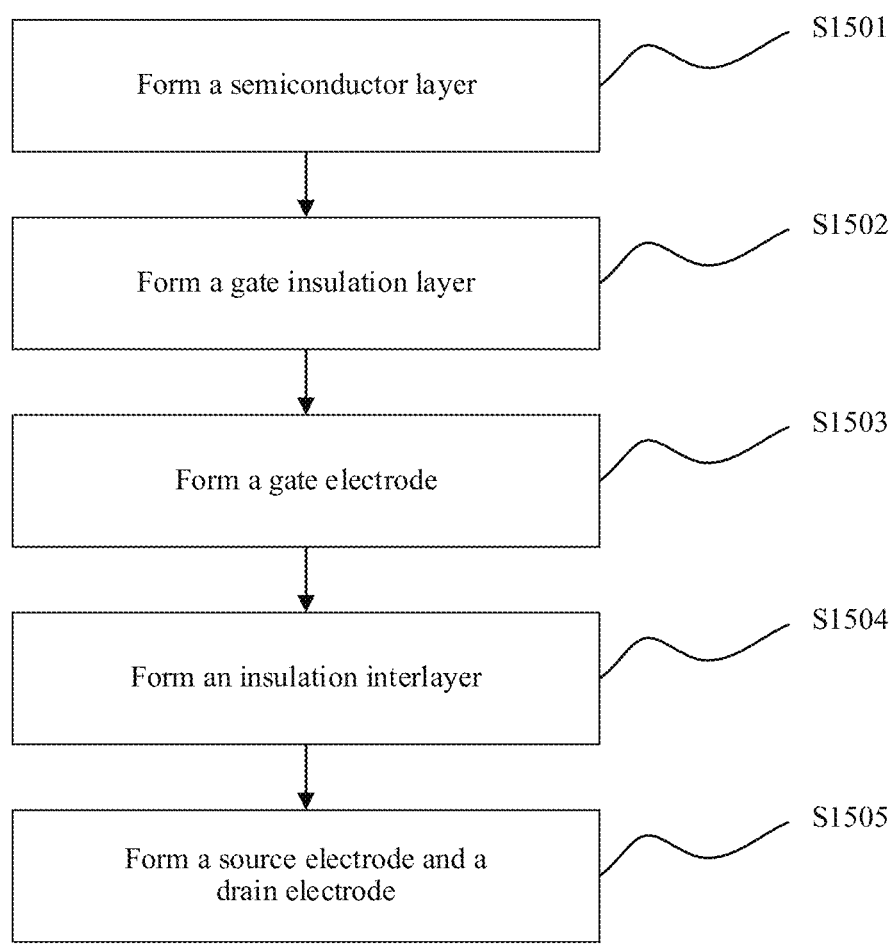
FIG. 14 shows a fabrication method for a driver backplane according to an embodiment of this application.

FIG. 14 shows a fabrication method for a TFT driver circuit backplane.

S1501. Form a semiconductor layer.

A polycrystalline silicon layer is formed on a buffer layer, and the semiconductor layer is formed by using a patterning process.

S1502. Form a gate insulation layer.

An inorganic material such as silicon oxide is deposited on an entire surface of the semiconductor layer to form the gate insulation layer.

S1503. Form a gate electrode.

Specifically, a metal layer may be deposited on the gate insulation layer by using a sputtering process, and then may be processed by using a patterning process to form the gate electrode. For the patterning process, reference may be made to the electrode processing process shown in FIG. 13. In some embodiments, by adding a circuit pattern of the third electrode 501 to a photomask, the third electrode 501 may be formed when the gate electrode is formed. The third electrode 501 is located at the gate insulation layer.

S1504. Form an insulation interlayer.

An inorganic material such as silicon oxide is deposited on the gate electrode to form the insulation interlayer.

S1505. Form a source electrode and a drain electrode.

The insulation interlayer and the gate insulation layer are etched to expose the semiconductor layer. A metal layer is deposited on the insulation interlayer and is processed by using a patterning process to form the source electrode and the drain electrode. In some embodiments, the third electrode 501 may alternatively be fabricated in this step. For a specific method thereof, reference may be made to S1503. By adding a circuit pattern of the third electrode 501 to a photomask, the third electrode 501 may be formed when the source electrode and the drain electrode are formed. The third electrode 501 is located at the insulation interlayer.

In the embodiments of this application, by utilizing a characteristic that the micro LED component is insensitive to water vapor, the micro LED component is placed in the bezel region of the AMOLED screen to replace a dam structure used to block water vapor. This achieves a full-screen display effect. In addition, in the bezel region, a small quantity of micro LED components need to be transferred, thereby effectively avoiding a difficulty in transferring a large quantity of micro LED components. A micro LED region of the AMOLED screen described in the embodiments of this application may be fabricated by using an existing technology for fabricating an AMOLED screen, to reduce a fabrication difficulty as much as possible.

For a purpose of explanation, the foregoing description is described with reference to a specific embodiment. However, the foregoing example discussion is not intended to be detailed, and is not intended to limit this application to a disclosed precise form. According to the foregoing teaching content, many modification forms and variation forms are possible. Embodiments are selected and described to fully illustrate the principles of this application and practical application of the principles, so that other persons skilled in the art can make full use of this application and various embodiments that have various modifications applicable to conceived specific usage.

What is claimed is:

1. A display, comprising:
a substrate, configured to carry components of the display;
a driver circuit backplane comprising a plurality of driver circuit units, wherein the driver circuit backplane is disposed above the substrate;
a first pixel layer comprising a plurality of first pixels, wherein each first pixel comprises a same plurality of first subpixels, each first subpixel comprises one organic light-emitting diode (OLED) component, the first pixel layer is disposed above the driver circuit backplane, and the OLED component of each first subpixel of the first pixel layer is connected to at least one driver circuit unit in the driver circuit backplane; and
a second pixel layer comprising a first electrode layer, a second electrode layer, and a plurality of second pixels disposed between the first electrode layer and the second electrode layer, wherein the second pixels comprise a first set of second pixels and a second set of second pixels, wherein each second pixel comprises a plurality of second subpixels, each second subpixel comprises one micro light-emitting diode (micro LED) component, and wherein the second subpixels of the first set of second pixels emit a different color combination than the second subpixels of the second set of second pixels, the second pixel layer is disposed above the substrate and surrounds the first pixel layer, and an area of the second pixel layer is less than that of the first pixel layer.

2. The display according to claim 1, wherein the micro LED component is a vertical type micro LED component comprising a top electrode and a bottom electrode, wherein the second electrode layer is above the first electrode layer, the bottom electrode is connected to the first electrode layer, and the top electrode is connected to the second electrode layer.

3. The display according to claim 2, wherein the second pixel layer further comprises a passivation layer disposed between the first electrode layer and the second electrode layer and that covers the vertical type micro LED component.

4. The display according to claim 3, wherein the passivation layer is provided with an opening above the top electrode, and the top electrode is connected to the second electrode layer through the opening.

5. The display according to claim 3, wherein each driver circuit unit comprises a plurality of transistors, source electrodes and drain electrodes of all transistors form a third electrode layer, gate electrodes of all the transistors form a fourth electrode layer, and the first electrode layer is located at the same layer as the third electrode layer—or the fourth electrode layer.

6. The display according to claim 1, wherein the first electrode is connected to a positive voltage of a power source, and the second electrode is connected to a negative voltage of the power source.

7. The display according to claim 1, wherein a second subpixel arrangement of the second pixel layer is a Pentile arrangement or a Bayer arrangement.

8. The display according to claim 5, wherein the display further comprises a thin film package layer disposed above the second electrode and covering the second electrode; or
the display further comprises a light shielding layer disposed above the driver circuit backplane and covering the first electrode layer; or
the vertical type micro LED component comprises an n-doped layer and a p-doped layer, the n-doped layer is connected to the top electrode of the vertical type micro LED component, and the p-doped layer is connected to the bottom electrode of the vertical type micro LED component; or
the first electrode layer is an opaque electrode layer, and the second electrode layer is a transparent electrode layer.

9. A display, comprising:
a substrate, configured to carry components of the display;
a driver circuit backplane comprising a plurality of driver circuit units, wherein the driver circuit backplane is disposed above the substrate;
a first pixel layer comprising a plurality of first pixels, wherein each first pixel comprises a same plurality of first subpixels, each first subpixel comprises one organic light-emitting diode (OLED) component, the first pixel layer is disposed above the driver circuit backplane, and the OLED component of each first subpixel is connected to at least one driver circuit unit in the driver circuit backplane; and
a second pixel layer comprising a plurality of second pixels, wherein the second pixels comprise a first set of second pixels and a second set of second pixels, wherein each second pixel comprises a plurality of second subpixels, each second subpixel comprises one micro light-emitting diode (micro LED) component, and wherein the second subpixels of the first set of second pixels emit a different color combination than the second subpixels of the second set of second pixels, the second pixel layer is disposed above the driver circuit backplane and surrounds the first pixel layer, an area of the second pixel layer is less than that of the first pixel layer, and the micro LED component of each second subpixel is connected to at least one driver circuit unit in the driver circuit backplane.

10. The display according to claim 9, wherein the micro LED component is a flip-type micro LED component comprising a P electrode and an N electrode, and the P electrode and the N electrode are located on a same side of the flip-type micro LED component.

11. The display according to claim 10, wherein the P electrode or the N electrode is connected to at least one driver circuit unit.

12. The display according to claim 11, wherein the display further comprises a thin film package layer covering the first pixel layer and the second pixel layer.

13. The display according to claim 12, wherein the driver circuit unit is a 2T1C driver circuit unit or a 5T1C driver circuit unit.

14. The display according to claim 13, wherein the driver circuit unit is connected to a negative voltage of a power source, and the P electrode is connected to a positive voltage of the power source.

15. The display according to claim 9, wherein a second subpixel arrangement of the second pixel layer is a Pentile arrangement or a Bayer arrangement.

16. The display according to claim 14, wherein the flip-type micro LED component is connected to the driver circuit unit through bonding; or
the thin film package layer comprises a first inorganic package layer, a second organic package layer, and a third inorganic package layer; or
the display further comprises a passivation layer disposed above the driver circuit backplane and below the first pixel layer and the second pixel layer; or
the display further comprises a planarization layer disposed above the driver circuit backplane and below the first pixel layer and the second pixel layer; or
the display further comprises a light shielding layer disposed above the driver circuit backplane and covers a first electrode layer; or
the first electrode layer and a second electrode layer are opaque electrode layers.

17. An electronic device, comprising:
a display and a battery, wherein the display comprises:
a substrate, configured to carry components of the display;
a driver circuit backplane comprising a plurality of driver circuit units, wherein the driver circuit backplane is disposed above the substrate;
a first pixel layer comprising a plurality of first pixels, wherein each first pixel comprises a same plurality of first subpixels, each first subpixel comprises one organic light-emitting diode (OLED) component, the first pixel layer is disposed above the driver circuit backplane, and the OLED component of each first subpixel is connected to at least one driver circuit unit in the driver circuit backplane; and
a second pixel layer comprising a first electrode layer, a second electrode layer, and a plurality of second pixels disposed between the first electrode layer and the second electrode layer, wherein the second pixels comprise a first set of second pixels and a second set of second pixels, wherein each second pixel comprises a plurality of second subpixels, each second subpixel comprises one micro light-emitting diode (micro LED) component, and wherein the second subpixels of the first set of second pixels emit a different color combination than the second subpixels of the second set of second pixels, the second pixel layer is disposed above the substrate and surrounds the first pixel layer, and an area of the second pixel layer is less than that of the first pixel layer; wherein
the driver circuit backplane, the first electrode layer, and the second electrode layer are coupled to the battery.

18. The electronic device according to claim 17, wherein the micro LED component is a vertical type micro LED component comprising a top electrode and a bottom electrode, wherein the second electrode layer is above the first electrode layer, the bottom electrode is connected to the first electrode layer, and the top electrode is connected to the second electrode layer.

19. The electronic device according to claim 18, wherein the second pixel layer further comprises a passivation layer disposed between the first electrode layer and the second electrode layer and covering the vertical type micro LED component.

20. The electronic device according to claim 19, wherein the passivation layer is provided with an opening above the top electrode of the vertical type micro LED component, and the top electrode is connected to the second electrode layer through the opening.

* * * * *

UNITED STATES PATENT AND TRADEMARK OFFICE
CERTIFICATE OF CORRECTION

PATENT NO. : 12,021,070 B2
APPLICATION NO. : 17/418386
DATED : June 25, 2024
INVENTOR(S) : Yanfeng Jia It is certified that error appears in the above-identified patent and that said Letters Patent is hereby corrected as shown below:

In the Claims

In Column 31, Line 10, in Claim 5, delete "layer—or" and insert -- layer or --.

Signed and Sealed this
Third Day of September, 2024

Katherine Kelly Vidal
*Director of the United States Patent and Trademark Office*